US008468611B2

(12) United States Patent
Riedo et al.

(10) Patent No.: US 8,468,611 B2
(45) Date of Patent: Jun. 18, 2013

(54) THERMOCHEMICAL NANOLITHOGRAPHY COMPONENTS, SYSTEMS, AND METHODS

(75) Inventors: Elisa Riedo, Atlanta, GA (US); Seth R. Marder, Atlanta, GA (US); Walt A. de Heer, Atlanta, GA (US); Robert J. Szoskiewicz, Manhattan, KS (US); Vamsi K. Kodali, Visakhapatnam (IN); Simon C. Jones, Los Angeles, CA (US); Takashi Okada, Mie (JP); Debin Wang, Atlanta, GA (US); Jennifer E. Curtis, Atlanta, GA (US); Clifford L. Henderson, Douglasville, GA (US); Yueming Hua, Sunnyvale, CA (US)

(73) Assignee: Georgia Tech Research Corporation, Atlanta, GA (US)

( * ) Notice: Subject to any disclaimer, the term of this patent is extended or adjusted under 35 U.S.C. 154(b) by 15 days.

(21) Appl. No.: 12/791,466

(22) Filed: Jun. 1, 2010

(65) Prior Publication Data
US 2011/0053805 A1    Mar. 3, 2011

Related U.S. Application Data

(60) Provisional application No. 61/182,190, filed on May 29, 2009.

(51) Int. Cl.
*G01Q 60/24* (2010.01)
*G01Q 60/38* (2010.01)
(52) U.S. Cl.
USPC ........ 850/33; 850/1; 850/40; 850/41; 850/42; 427/226; 427/227; 427/591

(58) Field of Classification Search
USPC .............. 850/1, 33, 40, 41, 42; 427/226, 227, 427/591
See application file for complete search history.

(56) References Cited

U.S. PATENT DOCUMENTS

| | | | |
|---|---|---|---|
| 6,835,534 B2 | 12/2004 | Weiss et al. |
| 6,936,194 B2 | 8/2005 | Watts |
| 7,416,911 B2 | 8/2008 | Heath et al. |
| 7,452,570 B1 | 11/2008 | Cannara et al. |
| 2003/0211421 A1 | 11/2003 | Hanabata et al. |
| 2005/0208304 A1 | 9/2005 | Collier et al. |
| 2007/0212555 A1 | 9/2007 | Cai et al. |
| 2008/0306225 A1 | 12/2008 | Prud'homme et al. |
| 2009/0053481 A1 | 2/2009 | Delapierre et al. |
| 2009/0096133 A1 | 4/2009 | Doyle et al. |

FOREIGN PATENT DOCUMENTS
WO    WO 03/053845    7/2003

OTHER PUBLICATIONS

Yu et al., Macromolecules, 2000, 33:5073-5079.*
International Search Report mailed Sep. 1, 2010 in Int'l Application PCT/US2010/036871 (1 pg.).
Written Opinion of the International Searching Authority mailed Sep. 1, 2010 in Int'l Application PCT/US2010/036871 (9 pgs.).
Martinez, R.V., et al., "Patterning Polymeric Structures with 2 nm Resolution at 3 nm Half Pitch in Ambient Conditions". *Nano Lett.*, 2007, p. 1846, vol. 7.

(Continued)

*Primary Examiner* — Ardin Marschel
*Assistant Examiner* — Jeremy C Flinders

(57) ABSTRACT

Improved nanolithography components, systems, and methods are described herein. The systems and methods generally employ a resistively heated atomic force microscope tip to thermally induce a chemical change in a surface. In addition, certain polymeric compositions are also disclosed.

20 Claims, 13 Drawing Sheets

OTHER PUBLICATIONS

Kane, R.S., et al., "Patterning proteins and cells using soft lithography". *Biomaterials*, 1999, p. 2363, vol. 20.

Mendes, P.M., et al., "Bio-nanopatterning of Surfaces". *Nanoscale Res. Lett.*, 2007, p. 373, vol. 2.

Christman, K.L., et al., "Nanopatterning proteins and peptides". *Soft Matter*, 2006, p. 928, vol. 2.

Salaita, K., et al., "Applications of dip-pen nanolithography". *Nat. Nanotechnol.*, 2007, p. 145, vol. 2.

Nie, Z.H., et al., "Patterning surfaces with functional polymers". *Nat. Mater.*, 2008, p. 277, vol. 7.

Huo, F.W., et al., "Polymer pen lithography". *Science*, 2008, p. 1658, vol. 321.

Bita, I., et al., "Graphoepitaxy of Self-Assembled Block Copolymers on Two-Dimensional Periodic Patterned Templates". *Science*, 2008, p. 939, vol. 321.

Mooney, J.F., et al., "Patterning of functional antibodies and other proteins by photolithography of silane monolayers". *Proc. Natl. Acad. Sci*, USA, 1996, p. 12287, vol. 93.

Denis, F.A., et al., "Alignment and Assembly of Adsorbed Collagen Molecules Induced by Anisotropic Chemical Nanopatterns". *Small*, 2005, p. 984, vol. 1.

Li, H.W., et al., "Nanocontact Printing: A Route to Sub-50-nm-Scale Chemical and Biological Patterning". *Langmuir*, 2003, p. 1963, vol. 19.

Spatz, J.P., "Nano- and Micropatterning by Organic-Inorganic Templating of Hierarchical Self-Assembled Structures". *Angew. Chem. Int. Ed.*, 2002, p. 3359, vol. 41.

Lee, K. B., et al., "Protein Nanoarrays Generated by Dip-Pen Nanolithography". *Science*, 2002, p. 1702, vol. 295.

Wadu-Mesthrige, K, et al., "Fabrication and Imaging of Nanometer-Sized Protein Patterns". *Langmuir*, 1999, p. 8580, vol. 15.

Hu, Y., et al., "Nanografting De Novo Proteins onto Gold Surfaces". *Langmuir*, 2005, p. 9103, vol. 21.

Zhao, Z.Y, et. al., "Simultaneous Targeted Immobilization of Anti-Human IgG-Coated Nanotubes and Anti-Mouse EgG-Coated Nanotubes on the Complementary Antigen-Patterned Surfaces via Biological Molecular Recognition". *J. Am, Chem. Soc.*, 2005, p. 8930, vol. 127.

Bruckbauer, A., et al., "Multicomponent Submicron features of Biomolecules Created by Voltage Controlled Deposition from a Nanopipet". *J. Am, Chem. Soc.*, 2003, p. 9834, vol. 125.

Kobayashi, Y., et al., "Writing and Reading Methodology for Biochips with Sub-100-nm Chemical Patterns Based on Near-Field Scanning Optical Microscopy". *Anal. Sci.*, 2008, p. 571, vol. 24.

Liu, M.Z., et al., "Production of Nanostructures of DNA on Surfaces". *Nano Lett.*, 2002, p. 863, vol. 2.

Demers, L.M., et al., "Direct Patterning of Modified Oligonucleotides on Metals and Insulators by Dip-Pen nanolithography". *Science*, 2002, p. 1836, vol. 296.

Zhou, X.Z., "Controlled Growthy of Peptide Nanoarrays on Si/SiOx Substrates". *Small*, 2008, p. 1324, vol. 4.

Zhang, H., "Biofunctionalized nanoarrays of inorganic structures prepared by dip-pen nanolithography". *Nanotechnology*, 2003, p. 1113, vol. 14.

Lee, S.W., et al., "Biologically Active Protein Nanoarrays Generated Using Parallel Dip-Pen Nanolithography". *Adv. Mater.*, 2006, p. 1133, vol. 18.

Ginger, D. S., et al., "The Evolution of Dip-Pen Nanolithography". *Angew. Chem. Int. Ed.*, 2004, p. 30, vol. 43.

Tinazli, A., et al., "Native protein nanolithography that can write, read and erase". *Nat. Nanotechnol.*, 2007, p. 220, vol. 2.

Arnold, M., et al., "Activation of Integrin Function by Nanopatterned Adhesive Interfaces". *ChemPhysChem*, 2004, p. 383, vol. 5.

Sheehan, P.E., et al., "Nanoscale deposition of solid inks via thermal dip pen nanolithography". *Appl, Phys, Lett.*, 2004, p. 1589, vol. 85.

Hermanson, G.T., *Bioconjugate Techniques*, Academic, London, 1996, pp. 64-575.

Park, J.U., et al., "Nanoscale Patterns of Oligonucleotides Formed by Electrohydrodynamic Jet Printing with Applications in Biosensing and Nanomaterials Assembly". *Nano Lett.*, 2008, p. 4210, vol. 8.

King, W. P., et al., "Thermomechanical formation of nanoscale polymer indents with a heated silicon tip,." *J. Heat Transf.*, 2007, pp. 1600-1604, vol. 129.

Vallieres, K., et al., "AFM Imaging of Immobilized Fibronectin: Does the Surface Conjugation Scheme Affect the Protein Orientation/Confirmation?". *Langmuir*, 2007, p. 9745, vol. 23.

Zamir, E., et al., "Molecular Complexity and dynamics of cell-matrix adhesions." *J. Cell Sci.*, 2001, p. 3583, vol. 114.

Vettiger, P., et al., "The 'Millipede'—Nanotechnology Entering Data Storage". *IEEE. Trans. Nanotechnol.*, 2002, p. 39, vol. 1.

Risko, C., et al., "An anionic organic mixed-valence system with a remarkably well-resolved vibrational structure in its intervalence band," *Chem. Commun.*, 2003, pp. 194-195.

Staub, K., et al., "Synthesis and stability studies of conformationally locked 4-(diarylamino)aryl and 4-(dialkylamino)phenyl-substituted second-order nonlinear optical polyene chromophores," *J. Mater. Chem.*, 2003, pp. 825-833, vol. 13.

Zojer, E., et al., "Limitations of essential-state models for the description of two-photon absorption processes: the example of bis(dioxaborine)-substituted chromophores," *J. Phys. Chem. B*, 2004, pp. 8641-8646, vol. 108.

Pond, S. J. K., et al., "Metal-ion sensing fluorophores with large two-photon absorption cross sections: Azacrown ether substituted donor-acceptor-donor distyryl benzenes," *J. Am. Chem. Soc.*, 2004, pp. 9291-9306, vol. 126.

Coropceanu, V., et al., "Electronic couplings in organic mixed-valence compounds: The contribution of photoelectron spectroscopy,." *J. Am. Chem. Soc.*, 2004, pp. 2727-2731, vol. 126.

Jones, S. C., et al., "Delocalization in platinum-alkynyl systems: A metal-bridged organic mixed-valence compound," *J. Am. Chem. Soc.*, 2004, pp. 11782-11783, vol. 126.

Kwon, O., et al., "Aromatic amines: A comparison of electron-donor strengths,." *J. Phys. Chem. A*, 2005, pp. 9346-9352, vol. 109.

Haddock, J. N., et al., "Colorless molecular dopants for low operating-voltage nematic liquid crystals," *Molec. Cryst. Liq. Cryst.*, 2005, pp. 17-32, vol. 428.

Haddock, J. N., et al., "A comprehensive study of short channel effects in organic field-effect transistors," *Org. Electron.*, 2006, pp. 45-54, vol. 7.

Zheng, S. J., et al., "Isolation and crystal structures of two singlet bis(triarylamine) dications with nonquinoidal geometries," *J. Am. Chem. Soc.*, 2006, pp. 1812-1817, vol. 128.

Zhan, X. W., et al., "Comparative studies of the geometric and electronic properties of 1,I-disubstituted-2,3,4,5-tetraphenylsiloles and 1, I,2,2-tetramethyl-3,4,5,6-tetraphenyl-I ,2-disila3,5-cydohexadiene," *J. Mater. Chem.*, 2006, pp. 3814-3822, vol. 16.

Chan, C K., et al., "n-Type doping of an electron-transport material by controlled gas-phase incorporation of cobaltocene," *Chem. Phys. Lett.*, 2006, pp. 67-71, vol. 431.

Barlow, S., et al., "Synthesis, ionisation potentials and electron affinities of hexaazatrinaphthylenederivatives." *Chem.-Eur. J.*, 2007, pp. 3537-3547, vol. 13.

Zheng, S. J., et al., "High two-photon cross-sections in bis(diarylaminostyryl) chromophores with electron-rich heterocycle and bis(heterocycle)vinylene bridges,." *Chem. Commun.*, 2007, pp. 1372-1374.

Zheng, S. J., et al., "Two-photon absorption in quadrupolar bis(acceptor)-terminated chromophores with electron-rich bis(heterocycle)vinylene bridges," *Chem. Mater.*, 2007, pp. 432-442, vol. 19.

Cho, J. Y., et al., "High electron mobility in nickel bis(dithiolene) complexes," *J. Mater. Chem.*, 2007, pp. 2642-2647, vol. 17.

Schmidt, K., et al., "Efficient acceptor groups for NLO chromophores: competing inductive and resonance contributions in heterocyclic acceptors derived from 2-dicyanomethylidene-3-cyano4,5,5-trimethyl-2,5-dihydrofuran," *J. Mater. Chem.*, 2007, pp. 2944-2949, vol. 17.

Haldi, A., et al., "Highly efficient green phosphorescent organic light-emitting diodes with simplified device geometry," *Appl. Phys. Lett.*, 2008, pp. 253502/1-253502/3, vol. 92.

Zhan, X., et al., "Fluorenyl-substituted silole molecules: geometric, electronic, optical, and device properties," *J. Mater. Chem.*, 2008, pp. 3157-3166, vol. 18.

Miao, S., et al., "Are N,N-dihydrodiazatelracene derivatives antiaromatic?" *J. Am. Chem. Soc.*, 2008, pp. 7339-7344, vol. 130.

Salomon, E., et al., "Quasi-epitaxy of a tris(thieno)hexaazatriphenylene derivative adsorbed on Ag(110): structural and electronic properties probed by scanning tunneling microscopy," *J. Phys. Chem. C*, 2008, pp. 9803-9807, vol. 112.

Zhao, W., et al., "Substrate-dependent electronic structure of an organic heterojunction." Phys. Rev. B, 2008, pp. 165336/1-165336/6, vol. 77.

Kondo, T., et al., "A nonvolatile organic memory device using ITO surfaces modified by Ag-nanodots," Adv. Funct. Mater., 2008, pp. 1112-1118, vol. 18.

Paniagua, S. A., et al., "Phosphonic acid modification of indium-tin oxide electrodes: combined XPSIUPS/contact angle studies," *J. Phys. Chem. C*, 2008, pp. 7809-7817, vol. 112.

Risko, C., et al., "Trends in electron-vibration and electronic interactions in bis(dimethylamino) mixed-valence systems: a joint experimental and theoretical investigation," *J. Phys. Chem. C*, 2008, pp. 7959-7967, vol. 112.

Rumi, M., et al., "Tetrastyrylarene derivatives: comparison of one- and two-photon spectroscopic properties with distyrylarene analogues," J. Phys. Chem. C, 2008, pp. 8061-8071, vol. 112.

Schmidt, K., et al., "Order of magnitude effects of thiazole regioisomerism on the near-IR two-photon cross-sections of dipolar chromophores," *Adv. Funct. Mater.*, 2008, pp. 794-801, vol. 18.

Ha, S. D., et al., "Commensurate growth and diminishing substrate influence in a multilayer film of a tris(thieno)hexaazatriphenylene derivative on Au(111) studied by scanning tunneling microscopy," *Phys. Rev. B*, 2008, pp. 085433/1-085433/7, vol. 77.

Li, T.-D., et al., "Nonlinear viscoelastic dynamics of nanoconfined wetting liquids," *Phys. Rev. Lett.*, 2008, pp. 106102, vol. 100.

Wang, D. B., et al., "Local wettability modification by thermochemical nanolithography with writeread-overwrite capability," *Appl. Phys. Lett.*, 2007, p. 24310411-3, vol. 91.

Szoszkiewicz, R., et al., "High-speed, sub-15 nm feature size thermochemical nanolithography," *Nano Lett.*, 2007, pp. 1064-1069, vol. 7.

Li, T. D., et al., "Structured and viscous water in subnanometer gaps," *Phys. Rev. B*, 2007, p. 115415, vol. 75.

Wang, Debin, et al., "Direct Writing and Characterization of Poly(p-phenylene vinylene) Nanostructures," *Appl. Phys. Lett.*, 2009, p. 223108-1, vol. 95.

Sirghi, L., et al., "Volume of a nanoscale water bridge," *Langmuir*, 2006, pp. 1093-1098, vol. 22.

Szoszkiewicz, R., et al., "Nucleation time of nanoseale water bridges," *Phys. Rev. Lett.*, 2005, p. 135502, vol. 95.

Szoszkiewicz, R., et al., "Nanoscopic friction as a probe of local phase transitions," *Appl. Phys. Lett.*, 2005, pp. 033105, vol. 87.

Palaci, I., et al., "Radial elasticity of multiwalled carbon nanotubes," *Phys. Rev. Lett.*, 2005, p. 175502, vol. 94.

Song, J., et al., "Elastic property of vertically aligned nanowires," *Nano Lett.*, 2005, pp. 1954-1958, vol. 5.

Song, J. H., et al., "Systematic study on experimental conditions for large-scale growth of aligned ZnO nanwires on nitrides," J. Phys. Chem. B, 2005, p. 9869-9872, vol. 109.

Szoszkiewicz, R., et al., "New AFM developments to study elasticity and adhesion at the nanoscale," In *Applied Scanning Probe Methods V*, Bhushan, B.; Fuchs, H.; Kawata, S., Eds. Springer: Berlin Heidelberg, 2007; pp. 269-286.

Merchan, L., et al., "Nanomechanics: elasticity in nano-objects," In *Fundamentals of Friction and Wear on the Nanoscale*, Gnecco, E.; Meyer, E., Eds. Springer: Berlin Heidelberg, 2007; pp. 219-254.

Nyffenegger, R. M., et al., "Nanometer-scale surface modification using the scanning probe microscope: progress since 1991," *Chem. Rev.*, 1997, pp. 1195-1230, vol. 97.

Garcia, R., et al., "Nano-chemistry and scanning probe nanolithographies," *Chem. Soc. Rev.*, 2006, pp. 29-38, vol. 35.

Park, M., et al., "Block copolymer lithography: Periodic arrays of $\sim 10^{11}$ holes in 1 square centimeter," *Science*, 1997, pp. 1401-1404, vol. 276.

Xia, Y. N., et al., "Soft lithography," *Ann. Rev. Mater. Sci.*, 1998, pp. 153-184, vol. 28.

Matsui, S., "Nanostructure.fabrication using electron beam and its application to nanometer devices," *Proc. IEEE*, 1997, pp. 629-643, vol. 85.

Samori, P., "Ed. Scanning probe microscopies beyond imaging: manipulation of molecules and nanostructures," *Wiley*, 2006.

Tseng, A. A., et al., "Nanofabrication by scanning probe microscope lithography: A review," *J Vac. Sci. Technol. B*, 2005, pp. 877-894, vol. 23.

Wang, Y. H., et al., "Controlling the shape, orientation, and linkage of carbon nanotube features with nano affinity templates," *Proc. Natl. Acad. Sci. USA*, 2006, pp. 2026-2031, vol. 103.

Müller, W. T., et al., "A strategy for the chemical synthesis of nanostructures," *Science*, 1995, pp. 272-273, vol. 268.

Kramer, S., et al., "Scanning probe lithography using self-assembled monolayers," *Chem. Rev.*, 2003, pp. 4367-4418, vol. 103.

Piner, R. D., et al., "'Dip-Pen' nanolithography," *Science*, 1999, pp. 661-663, vol. 283.

Bullen, D., et al., "Design, fabrication, and characterization of thermally actuated probe arrays for dip pen nanolithography," *J. Microelectromech. Syst.*, 2004, pp. 594-602, vol. 13.

Lyuksyutov, S. F., et al., "Electrostatic nanolithography in polymers using atomic force microscopy," *Nat. Mater.*, 2003, pp. 468-472, vol. 2.

Fresco, Z. M., et al., "AFM-induced amine deprotection: Triggering localized bond cleavage by application of tip/substrate voltage bias for the surface self-assembly of nanosized dendritic objects," *J Am. Chem. Soc.*, 2004, pp. 8374-8375, vol. 126.

Vettiger, P., et al., "The "Millipede"—More than one thousand tips for future AFM data storage," *IBM J Res. Develop.*, 2000, pp. 323-340, vol. 44.

Park, J., et al., "Chemically nanopatterned surfaces using polyelectrolytes and ultraviolet-cured hard molds," *Nano Lett.*, 2005, pp. 1347-1350, vol. 5.

Wang, Debin, et al., "Thermochemical Nanolithography of Multi-Functional Nanotemplates for Assembling Nano-Objects," *Adv. Funct. Mat.*, 2009, pp. 3696-3702, vol. 19.

Duvigneau, J., et al., "Atomic force microscopy based thermal lithography of poly(t-butyl acrylate) block copolymer films for bioconjugation," *Langmuir*, 2008, pp. 10825-10832, vol. 24.

Milner, A. A., et al., "Floating tip nanolithography," *Nano Lett.*, 2008, pp. 2017-2022, vol. 8.

Binnig, G., et al., "Ultrahigh-density atomic force microscopy data storage with erase capability," *Appl. Phys. Lett.*, 1999, pp. 1329-1331, vol. 74.

Durig, U., et al., "'Millipede'—an AFM data storage system at the frontier of nanotribology," *Tribol. Lett.*, 2000, pp. 25-32, vol. 9.

Basu, A. S., et al., "Scanning thermal lithography: Maskless, submicron thermochemical patterning of photoresist by ultracompliant probes," *J. Vac. Sci. Technol. B*, 2004, pp. 3217-3220, vol. 22.

Lee, J., et al., "Liquid operation of silicon microcantilever heaters," *IEEE Sensors J.*, 2008, pp. 1805-1806, vol. 8.

Nelson, B. A., et al., "Measuring material softening with nanoscale spatial resolution using heated silicon probes," *Rev. Sci. Instrum.*, 2007, pp. 023702/1-8, vol. 78.

Nelson, B. A., et al., "Modeling and simulation of the interface temperature between a heated silicon tip and a substrate," *Nanoscale Microscale Thermophys. Eng.*, 2008, pp. 98-115, vol. 12.

Lee, J., et al., "Electrical, thermal, and mechanical characterization of silicon microcantilever heaters," *J. Microelectromech. Syst.*, 2006, pp. 1644-1655, vol. 15.

Lee, J., et al., "Thermal conduction from microcantilever heaters in partial vacuum," *J. Appl. Phys.*, 2007, pp. 014906/1-014906/6, vol. 101.

Ricci, D., et al., "Bonding trends and dimensionality crossover of gold nanoclusters on metal-supported MgO thin films," *Phys. Rev. Lett.*, 2006, pp. 036106/1-036106/4, vol. 97.

Bongiorno, A., et al., "Water-enhanced catalysis of CO oxidation on free and supported gold nanoclusters," *Phys. Rev. Lett.*, 2005, pp. 106102/1-106102/4, vol. 95.

Bongiorno, A., et al., "Reaction of the oxygen molecule at the Si(100)—SiOz interface during silicon oxidation," *Phys. Rev. Lett.*, 2004, pp. 86102/1-86102/4, vol. 93.

Bongiorno, A., et al., "Transition structure at the Si(100)—SiO$_2$ interface," *Phys. Rev. Lett.*, 2003, pp. 186101/1-186101/4, vol. 90.

Bongiorno, A., et al., "A perspective on modeling materials in extreme environments: oxidation of ultra-high temperature ceramics," *MRS Bulletin*, 2006, pp. 410-418, vol. 31.

Grakoui, A., et al., "The immunological synapse: a molecular machine controlling T cell activation," *Science*, 1999, pp. 221-227, vol. 285.

Doh, J., et al., "Immunological synapse arrays: Patterned protein surfaces that modulate immunological synapse structure formation in T cells," *Proc. Natl. Acad. Sci. USA*, 2006, pp. 5700-5705, vol. 103.

Weatherspoon, M. R., et al., "Thin, conformal, and continuous SnO$_2$ coatings on three-dimensional biosilica templates through hydroxy-group amplification and layer-by-layer alkoxide deposition," *Angew. Chem. Int. Ed.*, 2007, pp. 5724-5727, vol. 46.

Morgenthaler, S., et al., "Surface-chemical and -morphological gradients," *Soft Matter*, 2008, pp. 419-434, vol. 4.

Jeon, N. L., et al., "Generation of solution and surface gradients using microfluidic systems," *Langmuir*, 2000, pp. 8311-8316, vol. 16.

Ruardy, T. G., et al., "Preparation and characterization of chemical gradient surfaces and their application for the study of cellular interaction phenomena," *Surf. Sci. Rep.*, 1997, pp. 1-30, vol. 29.

Fuierer, R. R., et al., "Patterning mesoscale gradient structures with self-assembled monolayers and scanning tunneling microscopy based replacement lithography," *Adv. Mater.*, 2002, pp. 154-157, vol. 14.

Geissler, M., et al., "Patterning of chemical gradients with submicrometer resolution using edge-spreading lithography," *Small*, 2006, pp. 760-765, vol. 2.

Julthongpiput, D., et al., "Gradient chemical micropatterns: a reference substrate for surface nanometrology," *Nano Letters*, 2005, pp. 1535-1540, vol. 5.

Lambert, A. G., et al., "Implementing the theory of sum frequency generation vibrational spectroscopy: a tutorial review," *Appl. Spectrosc. Rev.*, 2005, pp. 103-145, vol. 40.

Bailo, E., et al., "Tip-enhanced Raman spectroscopy of single RNA strands: towards a novel direct-sequencing method," *Angew. Chem. Int. Ed.*, 2008, pp. 1658-1661, vol. 47.

Anderson, M. S., "Locally enhanced Raman spectroscopy with an atomic force microscope," *Appl. Phys. Lett.*, 2000, pp. 3130-3132, vol. 76.

Hartschuh, A., et al., "High-resolution near-field Raman microscopy of single-walled carbon nanotubes," *Phys. Rev. Lett.*, 2003, pp. 095503/1-095503/4, vol. 90.

Rasmussen, A., et al., "Surface- and tip-enhanced Raman scattering of DNA components," *J. Raman Spectrosc.*, 2006, pp. 311-317, vol. 37.

Ren, B., et al., "Tip-enhanced Raman spectroscopy of benzenethiol adsorbed on Au and Pt single-crystal surfaces," *Angew. Chem. Int. Ed.*, 2005, pp. 139-142, vol. 44.

Stöckle, R. M., et al., "Nanoscale chemical analysis by tip-enhanced Raman spectroscopy," *Chem. Phys. Lett.*, 2000, pp. 131-136, vol. 318.

Wang, J. J., et al., "Controllable method for the preparation of metalized probes for efficient scanning near-field optical Raman microscopy," *Appl. Phys. Lett.*, 2005, pp. 263111/1-263111/3, vol. 86.

Yeo, B.-S., et al., "Tip-enhanced Raman spectroscopy can see more: the case of cytochrome c," *J. Phys. Chem. C*, 2008.

Valenzuela, R., "SPS PLANS lecture series on women in Physics," *CWSP Gazette, The Newsletter of the Committee on the Status of Women in the American Physical Society*, 2008, p. 7, vol. 27.

Gnecco, E., et al., "Linear ripples and traveling circular ripples produced on polymers by thermal AFM probes," *Phys. Rev. B*, 2009, pp. 235-421, vol. 79.

Bhushan, B. "Applied Scanning Probe Methods IV: Industrial Applications." Springer-Verlag: Berlin, 2006.

Yoo, S.; et al. "Analysis of improved photovoltaic properties of pentacene/C-60 organic solar cells: Effects of exciton blocking layer thickness and thermal annealing." *Solid-State Electron.* 2007, 51, 1367-1375.

Cleveland, J.P. et al. "A Nondestructive method for determining the spring constant of cantilevers for scanning force microscopy". Review of Scientific Instruments, 1993, 64.

Hutter et al. "Calibration of atomic-force microscope tips." Review of Scientific Instruments, 1993, 64.

Sader, J.E. et al. "Calibration of rectangular atomic force microscope cantilevers." Review of Scientific Instruments, 1999, 70.

Gibson, C.T. et al. "Determination of the spring constants of probes for force microscopy/spectroscopy", Nanotechnology, 1996, 7.

Gibson, C.T. et al. "A nondestructive technique for determining the spring constant of atomic force microscope cantilevers" Review of Scientific Instruments, 2001, 72.

* cited by examiner

THERMOCHEMICAL NANOLITHOGRAPHY COMPONENTS, SYSTEMS, AND METHODS

CROSS-REFERENCE TO RELATED APPLICATION

The present application claims the benefit of U.S. Provisional Patent Application Ser. No. 61/182,190, filed 29 May 2009, and entitled "Thermochemical Nanolithography of Multi-Functional Materials," which is hereby incorporated by reference in its entirety as if fully set forth below.

STATEMENT OF FEDERALLY SPONSORED RESEARCH

This invention was made with United States Government support under Grant Nos. DMR-0120967, DMR-0820382, and DMR-0706031 all awarded by the National Science Foundation and Grant No. DE-FG02-06ER46293 awarded by the Department of Energy. The United States Government has certain rights in this invention.

TECHNICAL FIELD

The various embodiments of the present invention relate generally to nanolithography. More particularly, the various embodiments of the present invention relate to systems and methods for implementing chemical nanolithography techniques, the components used to implement such techniques, and the patterned materials formed therefrom.

BACKGROUND

Nanolithography has been recognized as essential to future technologies. Many currently existing lithographic techniques, however, have significant limitations in terms of resolution, writing speed, and the chemical diversity of the materials that can be patterned on a particular substrate. Lithographic techniques employing scanning probe microscopy (SPM) have become increasingly popular due to their potential application in low-cost and/or parallelized fabrication of nanoscale structures. For the most part, SPM-based techniques have been used for direct writing of nanostructures through indentation or through material deposition and/or removal, as well as for normal resist exposures as masks for other lithographic processes. By way of example, dip-pen nanolithography (DPN) offers several interesting capabilities, but requires stringent control over the environment/atmosphere and has limitations in substrate choice, patterning speed, and topographical change control.

Recently it has been demonstrated that SPM tips can act as mechanical, thermal, and/or electrical sources to initiate and perform various physical and chemical processes. These tips are inherently simple and reliable, and have the flexibility to create patterns with nanoscale spatial resolution. In fact, such techniques are capable of creating topographical nanopatterns with a spatial resolution on the order of about 10 nanometers (nm). In contrast, achieving chemical patterning, even at resolutions of less than or equal to about 100 nm, still remains a challenge because of the difficulty in spatially confining chemical reactions and because of the need to control the interactions of the reactant and products with the substrates and, if necessary, stamps. By extension, combining the two concepts (i.e., topographical and chemical nanopatterning) has been even more challenging.

There accordingly remains a need in the art for improved lithographic techniques. Significant new opportunities could open up with the development of these improved techniques. The biotechnology arena provides just one illustration of such opportunities. At the forefront of nanobiotechnology is the challenge to manipulate and control the surface positioning of individual proteins, nanoparticles, and other complex nanostructures. Achieving this aim could facilitate the development of protein chips with single molecule detection capability, nanoelectronics devices, and to assist in fundamental studies of complex cell-cell and cell-matrix interactions (e.g., formation of immunological synapses, focal contacts, and the like).

While advances have been made in patterning inorganic nanoscale objects, challenges still exist, in particular, for protein and DNA nanolithography. Many protein nanopatterning techniques are unable to produce features below 100 nm, and even fewer can attain resolutions on the order of about 50 nm. In addition, only a few protein nanopatterning techniques have been established for independently patterning multiple protein species on the same surface. Still further, bioactivity is a particularly delicate problem because denaturation, oxidation, and dehydration in air are common drawbacks that complicate many potential protein nanopatterning techniques. These considerations also limit the choice of surfaces onto which the proteins can be patterned. For example, proteins directly chemisorbed onto gold tend to denature.

Thus, new protein or DNA nanopatterning techniques should strive to obtain resolutions below 50 nm, achieve high writing speeds, reduce costs, produce multiple functionalities that can coexist on a single surface, preserve biological functionality, and be compatible with a variety of substrates.

BRIEF SUMMARY

The various embodiments of the present invention provide compositions and lithography systems and methods that can overcome the above-described deficiencies associated with currently existing nanolithography techniques.

A method of modifying a surface according to some embodiments of the present invention includes providing a surface having a first functional group at a first location on the surface, resistively heating an atomic force microscope tip to a specific temperature, positioning the resistively heated atomic force microscope tip adjacent to (or in contact with) the first location so as to heat the first location on the surface, and removing the first functional group from at least a portion of the first location on the surface such that the surface comprises a second functional group at least a portion of the first location. In some cases it is possible to achieve this change of functional group with only a very small change in the spatial position of the second functional group, before and after heating.

In implementing the method, the first functional group can be a tetrahydropyranyl carbamate, amine N-oxide, tetrahydropyranyl ether, triphenylmethyl ether, tetrahydropyranyl carbonate ester, S-tetrahydropyranyl carbonyl, or ethyl disulfide. Similarly, the second functional group can be an amine, alcohol, phenol, or thiol.

In some cases, the method can further include discontinuing the positioning of the resistively heated atomic force microscope tip adjacent to (or in contact with) the first location. In these cases, if desired, the method can also include repositioning the resistively heated atomic force microscope tip adjacent to (or in contact with) a second location on the surface effective to heat the second location. The second location can have the same or a different functional group (i.e., the first functional group or a third functional group, respectively). If desired, this method can also include removing the same or different group from at least a portion of the second location such that the surface comprises the second functional group or a still a different (i.e., a fourth) functional group at least a portion of the second location. It is possible to resistively heating the atomic force microscope tip to a different temperature before repositioning the resistively heated atomic force microscope tip adjacent to (or in contact with) the second location on the surface.

In other situations, the method can further include moving the resistively heated atomic force microscope to a second location on the surface while continuously maintaining the resistively heated atomic force microscope tip adjacent to (or in contact with) the surface all the way from the first location to the second location such that the surface from the first location to the second location is heated. At least a portion of the surface from the first location to the second location can have the first functional group or a third functional group. In such situations, the method can further include removing the first functional group or the third functional group from at least a portion of the surface all the way from the first location to the second location, such that the surface comprises the second functional group or a fourth functional group at least a portion of the surface over the distance from the first location to the second location.

The speed of the moving tip relative to the surface can be greater than 50 micrometers per second. In some cases, the moving speed can be greater than 1 millimeter per second.

The distance between the first location and the second location can be anywhere from 1 nanometer to as far as the two most distant points on the surface. In some cases, the distance can be less than or equal to about 15 nanometers.

The method also allows for the second or fourth functional groups to be separately functionalized.

It is also possible to dispose a biological material, a nanoscale object (i.e., having an average longest dimension of less than or equal to about 100 nanometers), or a microscale object (i.e., having an average longest dimension of less than or equal to about 10 micrometers) on the second or fourth functional groups, whether or not they have been separately functionalized.

In some cases, the surface is formed from a polymer. This polymer can be cross-linked before positioning the resistively heated atomic force microscope tip adjacent to (or in contact with) the first location of the polymer. The polymer can be disposed on a substrate before positioning the resistively heated atomic force microscope tip adjacent to (or in contact with) the first location of the polymer. If the substrate comprises a surface-modification comprising a cross-linking group, a covalent bond can be formed to the polymer. For example, the cross-linking group of the surface-modification can be a benzophenone moiety that is sensitive to ultraviolet radiation.

According to some other embodiments of the present invention, a method of modifying a surface can include providing a surface comprising a precursor of a composition at a first location, resistively heating an atomic force microscope tip to a specific temperature, positioning the resistively heated atomic force microscope tip adjacent to (or in contact with) the first location effective to heat the first location, and transforming at least a portion of the precursor of the composition at the first location into the composition itself. The composition can be, for example, a metal, conductive polymer (e.g., poly(p-phenylene vinylene) or the like), graphene, or a ceramic (e.g., graphene oxide, reduced graphene oxide, or the like).

In certain cases, this method can also include discontinuing the positioning of the resistively heated atomic force microscope tip adjacent to (or in contact with) the first location. In such cases, the method can also include repositioning the resistively heated atomic force microscope tip adjacent to (or in contact with) a second location on the surface effective to heat the second location, wherein the second location comprises the precursor of the composition (or even a precursor of another composition). It is also possible to transform at least a portion of the precursor of the composition (or of the other composition) at the second location into the composition (or the other composition).

In other cases, the method can also include moving the resistively heated atomic force microscope to a second location on the surface while continuously maintaining the resistively heated atomic force microscope tip adjacent to (or in contact with) the surface all the way from the first location to the second location so as to heat part or all of the surface all the way from the first location to the second location, wherein at least a portion of the surface from the first location to the second location comprises the precursor to the composition (or another composition). In these cases, the method can further include transforming at least a portion of the precursor of the composition (or of the other composition) from at least a portion of surface from the first location to the second location into the composition (or the other composition).

The speed of the moving in this method can also be greater than 50 micrometers per second. In some cases, the moving speed can be greater than 1 millimeter per Second.

Similarly, the distance between the first location and the second location can be anywhere from 1 nanometer to as far as the two most distant points on the surface. In some cases, the distance can be less than or equal to about 15 nanometers.

This method also allows for the composition (or the other composition) to be separately functionalized.

It is also possible to dispose a biological material, a nanoscale object, or a microscale object on the composition (or the other composition), whether or not they have been separately functionalized.

According to some embodiments of the present invention, a system for modifying a surface can include an atomic force microscope, an atomic force microscope tip, and a resistive heater in electrical communication with the atomic force microscope tip. The resistive heater can be configured to provide sufficient heat to the atomic force microscope tip to transfer the heat to a first location on a surface when the atomic force microscope tip is positioned adjacent to (or in contact with) the first location.

In some cases, such transferred heat can be effective to remove a first functional group from at least a portion of the first location such that the surface comprises a second functional group at least a portion of the first location. In these cases, the first functional group can be a tetrahydropyranyl carbamate, amine N-oxide, tetrahydropyranyl ether, triphenylmethyl ether, tetrahydropyranyl carbonate ester, S-tetrahydropyranyl carbonyl, or ethyl disulfide. Similarly, the second functional group can be an amine, alcohol, phenol, or thiol.

In other cases, the transferred heat can be effective to convert a precursor of a composition at least a portion of the first location into the composition itself. In these cases, the composition can be a metal, conductive polymer, graphene, or a ceramic.

According to some embodiments, a composition can include a polymer represented by a formula $Y_n$-$P_n$-$G_n$, wherein n is a positive integer, Y is a cross-linking functional group, P is a backbone of the polymer, and G is a protecting functional group. The protecting functional group can be configured to chemically react when exposed to heat at a temperature above a thermal deprotection temperature so as to form a different functional group. The polymer, once cross-linked, does not have to soften above the thermal deprotection temperature.

In some cases, the ratio of Y:P is as high as about 99:1. In other cases this ratio is as low as about 1:1.

In some situations, G can be a tetrahydropyranyl carbamate, amine N-oxide, tetrahydropyranyl ether, triphenylmethyl ether, tetrahydropyranyl carbonate ester, S-tetrahydropyranyl carbonyl, or ethyl disulfide.

Similarly, in some situations, the different functional group is an amine, alcohol, phenol, or thiol.

Other variations to the polymer involve the polymer being a co-polymer, such that P comprises at least two components. In these situations, Y and G can be on different components of P. For example, Y can be a cinnamate group and G can be a tetrahydropyran carbamate group.

In one case, the polymer is represented by the following formula:

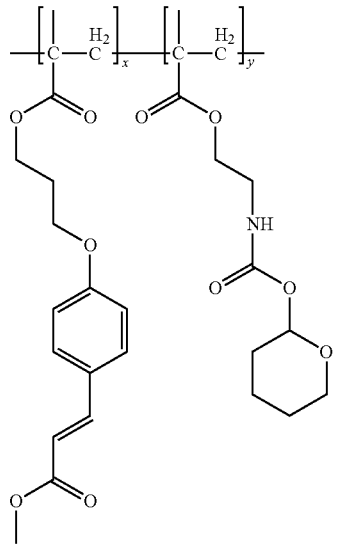

Other aspects and features of embodiments of the present invention will become apparent to those of ordinary skill in the art, upon reviewing the following detailed description in conjunction with the accompanying figures.

BRIEF DESCRIPTION OF THE DRAWINGS

FIG. 6a illustrates that Alexa350 labeled biotinylated anti-human CD3 bound to the TCNL amine pattern by means of NHS-biotin and streptavadin shows bioactive molecular recognition of FITC-labeled IgG; while FIG. 6b illustrates Jurkat cells, immunostained for PKC-0, lying on a triangular anti-CD3 pattern such that the PKC-0 accumulation above the cell-pattern contact site can be observed; and FIG. 6c illustrates that anti-CD3 and ICAM-1 were closely co-patterned on a single surface.

FIG. 12a includes a room-temperature AFM current image, taken with a bias voltage of 2.5V between tip and substrate, of a zig-zag-shaped nanoribbon fabricated by TCNL on epitaxial graphene oxide ($GO_{epi}$) at $T_{heater}$ of about 1060° C. with a linear speed of about 0.2 μm/s and a load of 120 nN in accordance with some embodiments of the present invention.

FIG. 12b illustrates the corresponding topography image taken simultaneously with the image of FIG. 12a.

FIG. 12c illustrates the averaged profiles of current and height of the cross-sections that are indicated as dashed lines in FIG. 12b.

DETAILED DESCRIPTION

Figure 1:
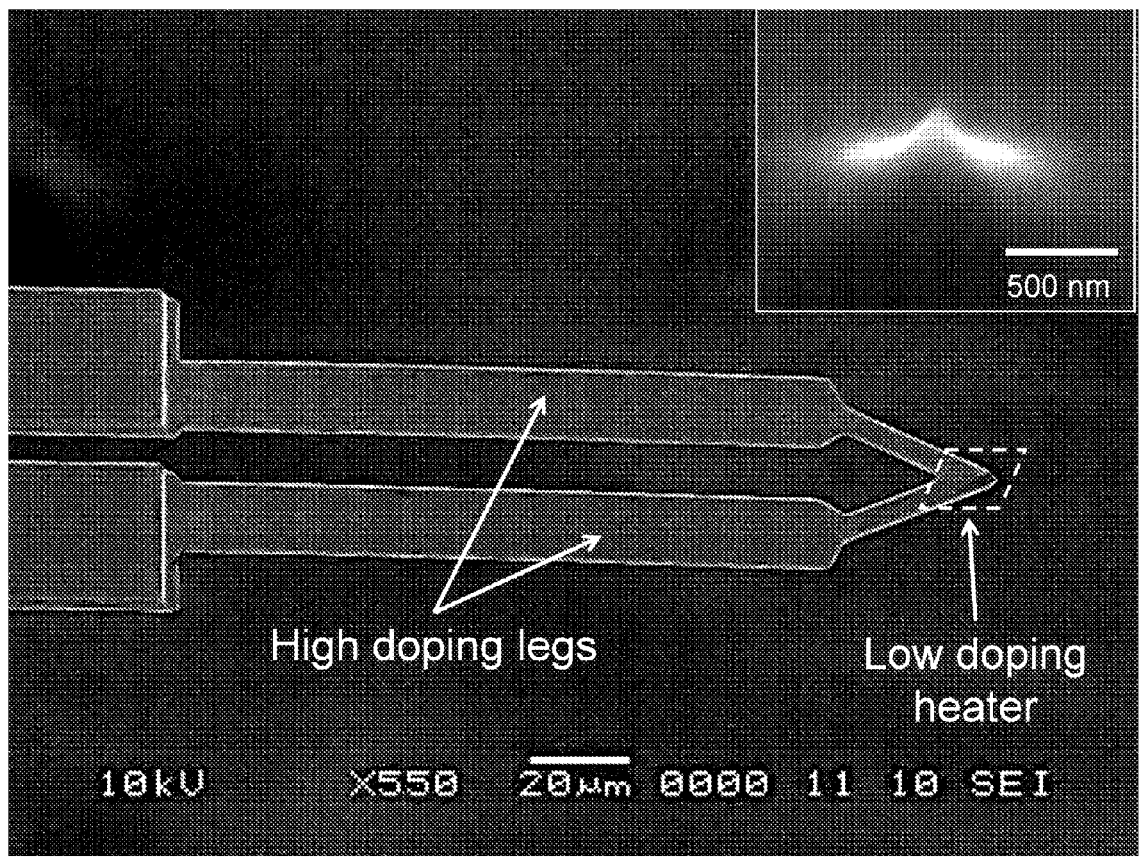
FIG. 1 is a scanning electron micrograph of an atomic force microscope (AFM) tip with an integrated resistive heater in accordance with some embodiments of the present invention.

Referring now to the figures, wherein like reference numerals represent like parts throughout the several views, exemplary embodiments of the present invention will be described in detail. Throughout this description, various components can be identified as having specific values or parameters, however, these items are provided as exemplary embodiments. Indeed, the exemplary embodiments do not limit the various aspects and concepts of the present invention as many comparable parameters, sizes, ranges, and/or values can be implemented. The terms "first," "second," and the like, "primary," "secondary," and the like, do not denote any order, quantity, or importance, but rather are used to distinguish one element from another. Further, the terms "a," "an," and "the" do not denote a limitation of quantity, but rather denote the presence of "at least one" of the referenced item.

Disclosed herein are improved nanolithography systems, materials, and methods that make use of a resistively-heated atomic force microscope (AFM) tip to thermally activate a chemical reaction on the surface of a chosen material. Such chemical nanopatterning systems and methods, termed "thermochemical nanolithography" (TCNL), provide significant advantages over existing nanolithography techniques. As will be described in more detail below, TCNL is capable of obtaining resolutions well below 50 nm, achieving high writing speeds (e.g., greater than 1 millimeter per second (mm/s)), and/or producing multiple functionalities on a particular surface. In addition, TCNL is compatible with a variety of surfaces or substrates. In situations where biological materials are patterned, TCNL also offers the advantage that it can preserve biological functionality or bioactivity. In general, these benefits can be attained at reduced costs compared to many existing nanolithography techniques.

Generally, a TCNL system includes an AFM, an AFM tip (or a plurality of AFM tips), and a resistive heater in electrical communication with the AFM tip. For illustrative convenience, when referring herein to an AFM instrument itself (i.e., without an AFM tip attached thereto), it is intended that the AFM include any necessary constituents and equipment necessary to operate the AFM, as would be understood by those skilled in the art to which this disclosure pertains. Examples of such constituents include a probe head, a camera module, a piezoelectric scanner for embodiments where the surface that is patterned will move, optics to monitor the movement and position of the AFM tip, a device (if desired) to monitor atmospheric conditions (e.g., humidity, pressure, temperature, and the like), a chamber or other materials (if desired) to isolate the AFM from outside noise, and/or the like. Similarly, examples of such equipment for operating the AFM include a controller unit for controlling the AFM constituents, a computer with software for sending, receiving, and processing electronic signals to and from the controller and/or the AFM constituents, and/or the like.

Similarly, as used herein, the term "AFM tip" is intended to include both a cantilever and tip, which is located at the end of the cantilever, as would be understood by those skilled in the art to which this disclosure pertains. The AFM tip can be any type of silicon, silicon nitride, or other composition AFM tip known to those skilled in the art.

As stated above, the resistive heater is in electrical communication with the AFM tip. Specifically, the resistive heater can be physically coupled to the AFM tip (e.g., via the cantilever or cantilever holder of the AFM instrument), or it can comprise a portion of the AFM tip. In exemplary embodiments, the resistive heater comprises a portion of the AFM tip. Such AFM tips are known to those skilled in the art to which this disclosure pertains.

One type of AFM tip with an integrated resistive heater is described in Lee et al., "Electrical, Thermal, and Mechanical Characterization of Silicon Microcantilever Heaters," Journal of Microelectromechanical Systems, 15, 1644 (2006), which is incorporated herein by reference as if fully set forth below. Briefly, these tips are made using a standard silicon-on-insulator (SOD process. The process starts with providing a SOI wafer having a <100> orientation, and n-type doping it at $2 \times 10^{14}$ atoms per cubic centimeter ($cm^{-3}$) to have a resistivity of about 4 ohm-centimeters (Ω-cm). The cantilever tip can be formed using an oxidation sharpening process such that it has a radius of curvature about 20 nm and a height of about 1.5 micrometers (μm). The cantilevers are made electrically active by selectively doping different parts of the cantilever through a two-step process. First, a low-dosage blanket ion implantation can be performed on the entire cantilever, followed by furnace-annealing in order to establish an essentially uniform background doping level (e.g., $10^{17}$ $cm^{-3}$, phosphorous, n type). The cantilever then can be subjected to a heavy implantation step during which a region around the tip (e.g., having a width of about 8 μm) is masked off ($10^{20}$ $cm^{-3}$, phosphorous n type). The masked region serves as a relatively lightly-doped region at the free end of the cantilever. It is this lightly-doped region that functions as the resistive heater. Finally, the cantilever can be electrically connected to the base via highly conducting legs (e.g., having a length of about 110 μm and a width of about 15 μm). With the cantilever dimensions and temperature-dependent resistivity, the resistive heater portion can account for more than about 90% of the electrical resistance of entire cantilever. An example of such an AFM tip is shown in the scanning electron microscope (SEM) image of FIG. 1.

Figure 2:
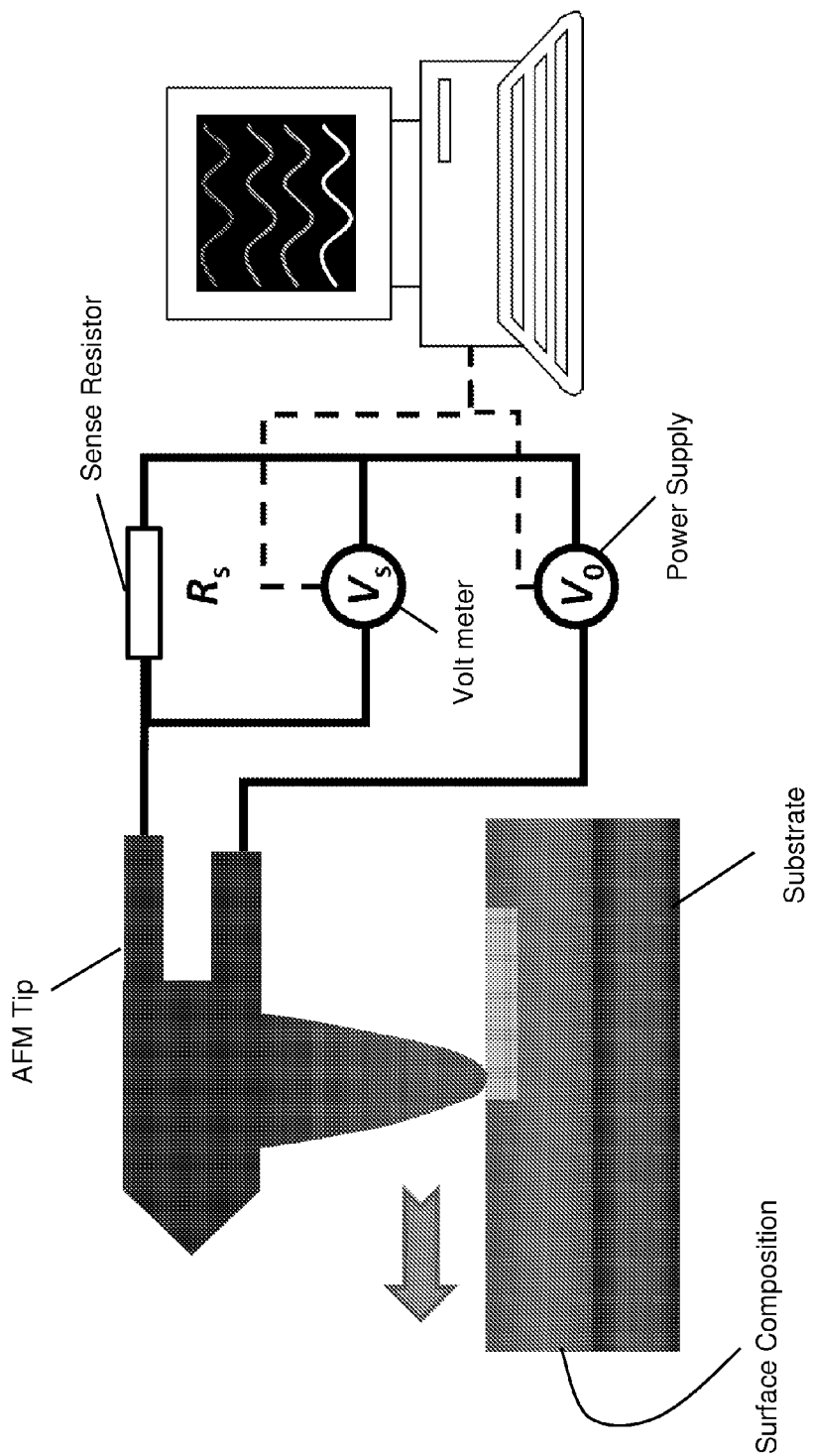
FIG. 2 is a schematic illustration of a thermochemical nanolithography (TCNL) system in accordance with some embodiments of the present invention.

In some cases, the AFM tip, regardless of how the resistive heater is placed in electrical communication thereto, can require modification of the original/standard cantilever- or chip-holder of the AFM instrument in order to provide current to heat the AFM tip. One such modification can include creating an electrical pathway or circuit for current to be applied (e.g., from a power source) to the AFM tip in a specific direction. This can be as simple as providing electrical leads to each side of the cantilever. If it is desirable to monitor the current applied to the AFM tip (e.g., for greater control of the heat generated at the AFM tip), then a voltmeter, multimeter, or like device can be included as part of electrical circuit. Further, if additional protective measures for the AFM tip are desired, then a sense resistor or like device can be placed in series with the AFM tip to limit the current applied to the AFM tip. These optional additional modifications can be useful for monitoring and/or controlling the temperature of the AFM tip during the TCNL process. An example of a TCNL system with an AFM tip having each of these modifications is illustrated in FIG. 2.

Once the TCNL system is fabricated or constructed, it can be used to pattern a surface. Such a process generally involves resistively heating the AFM tip to a desired temperature, positioning the resistively heated AFM tip adjacent to, or in contact with, a first location on a surface effective to heat the first location, and chemically modifying at least a portion of the first location. In certain cases, particularly when the AFM tip is brought into contact with the surface, the chemical modification can also be a topographical modification.

The process can be repeated by discontinuing the positioning (i.e., removing the AFM tip away from the first location on the surface), and re-positioning the heated AFM tip with the surface at a second location so as to generate another chemical modification at the second location. This allows for multiple discrete locations on the surface to be patterned.

Alternatively, the process can be continued by moving the AFM tip to a second location on the surface, while maintaining continuous proximity or contact between the heated AFM tip and the surface from the first location all the way to the second location. This allows for a continuous pattern (i.e., chemical modification) to form on the surface from the first location through and to the second location. In this manner, both one- and two-dimensional patterns can be formed on the surface.

The cause of the chemical modification is the heat that is transferred from the AFM tip to the material of the surface. Too little heat can result in no chemical modification, too much heat can result in excessive chemical modification (e.g., from thermal transfer beyond the area of proximity or contact between the AFM tip and the surface, from additional chemical modification or even thermal decomposition of the surface, or both), and inconsistent heat can result in unintended patterning of the surface. Thus, in exemplary embodiments, a temperature calibration process is performed on the AFM tip prior to initiating the TCNL process. The AFM tips can be calibrated using thermometry techniques including optical thermometry micro-infrared thermometry, Raman spectroscopy, or the like. That is, these techniques can be used to measure the temperature of the AFM tip at different electrical resistances or power levels in order to find the appropriate resistance or power level needed for a particular chemical modification.

In some cases, depending on the location of the resistive heater, there can be a temperature gradient in the AFM tip itself. Thus, such calibration techniques can be used map the temperature profile of the entire AFM tip.

In addition to the temperature of the AFM tip, the amount of heat transferred to the surface can be influenced by the pressure applied by the AFM tip to the surface. Thus, in exemplary embodiments, the spring constant of the AFM tip is also calibrated. There are different methods for determining the spring constant of the AFM tip, depending on its shape or geometry. Such methods are known to those skilled in the art to which this disclosure pertains. Additional information on calibration techniques can be found in the following references, which are incorporated herein in their entireties as if fully set forth below: Cleveland et al., "A nondestructive method for determining the spring constant of cantilevers for scanning force microscopy," Review of Scientific Instruments, 64, 403 (1993); Hutter et al., "Calibration of atomic-force microscope tips," Review of Scientific Instruments, 64, 1868 (1993); Sader et al., "Calibration of rectangular atomic force microscope cantilevers," Review of Scientific Instruments, 70, 3967 (1999); Gibson et al., "Determination of the spring constants of probes for force microscopy/spectroscopy," Nanotechnology, 7, 259 (1996); and Gibson et al., "A nondestructive technique for determining the spring constant of atomic force microscope cantilevers," Review of Scientific Instruments, 72, 2340 (2001).

Yet another feature that can influence the amount of heat transferred to the surface is the exposure time itself. For embodiments where patterning speed is of importance, the AFM tip will spend less time in a particular location and, therefore, less opportunity to effect complete thermal transfer from the AFM tip to the surface if the AFM tip is heated to the exact temperature needed to initiate the chemical modification. Thus, in these cases, those skilled in the art will recognize that the AFM tip should be heated to a temperature greater than the minimum chemical modification temperature in order to ensure sufficient thermal transfer for the desired chemical modification to occur. The extent to which the temperature of the AFM tip exceeds the minimum chemical modification temperature will depend on the positioning or exposure time. That is, shorter exposure times will require greater temperatures in order to produce the same level of chemical modification as greater exposure times with lower temperatures, assuming that the AFM tip is kept the same distance from the surface or (in cases where contact is made) that the pressure of the AFM tip on the surface is kept the same.

The extent to which heat is transferred from the AFM tip to the material of the surface will influence the resolution of the pattern. Thus, in addition to the general AFM tip geometry, each of the factors listed above will affect both the thickness/fineness of a particular patterned shape and the density of patterned shapes that can be created in a given area of the surface.

Turning now to the surface itself, there are a variety of compositions that can be used to form the surface that is patterned or modified. In fact, any composition that can undergo a chemical reaction initiated by heat can be used to form the surface. Among the localized changes in the material that forms the surface that can be induced by the chemical reaction are one or more of the local elastic, mechanical, tribological, optical, wetting, adhesive, electrical, or chemical properties.

In general, the surface can be a liquid or solid. When the surface is a liquid, it can be placed in a container or vessel before being patterned using TCNL. As a solid, the surface can be a discrete body, or it can be disposed upon another material (e.g., a platform/substrate that can provide greater mechanical stability, for example, if the surface material itself is highly, thin or flexible).

In some embodiments, the surface is formed from a polymeric material. In general, the surface can be formed from polymers having the basic structure $P_n$-$G_n$, wherein P represents the polymer backbone, G represents a functional group that will be modified by TCNL, and n is a positive integer. The functional group, G, can form part of a polymer side-chain, or can be part of the polymer backbone. It should be noted that there can be more than one polymer backbone and/or functional group in the chosen polymer. Before TCNL, the polymer can be formed into a film using standard film-forming techniques such as spin-coating, drop casting, blade coating, and spray coating onto a substrate or platform. If desired, the substrate can be removed before subjecting the polymer film to TCNL.

In some embodiments, the polymer backbone, P, can be derived from, or can be, a monomer such as vinyl, allyl, 4-styryl, acroyl, epoxide, oxetane, cyclic-carbonate, methacroyl, acrylonitrile, or the like, which is polymerized by either a radical-, cationic-, atom transfer-, or anionic-polymerization process. In other cases, P can be derived from, or can be, an isocyanate, isothiocyanate, or epoxide, that can be copolymerized with di-functional amines or alcohols such as $HO(CH_2)_\lambda OH$, $H_2N(CH_2)_\lambda NH_2$, where $\lambda$ is a positive integer (e.g., from 1 to 25). In other situations, P can be derived from, or can be, a strained ring olefin (e.g., dicyclopentadienyl, norbornenyl, cyclobutenyl, or the like), which can be polymerized via ring opening metathesis polymerization using an appropriate metal catalyst, as would be known by those skilled in the art to which this disclosure pertains. In still other embodiments, P can be derived from, or can be, $(—CH_2)_nSiCl_3$, $(—CH_2)_nSi(OCH_2CH_3)_3$, or $(—CH_2)_nSi(OCH_3)_3$, where the monomers can be reacted with water under conditions known to those skilled in the art to form either thin film or monolithic organically modified sol-gel glasses, or modified silicated surfaces, where $n$ is a positive integer (e.g., from 1 to 25). Still further, P can be derived from, or can be, a polymerizable group that can be photochemically dimerized or polymerized. Such groups can include one or more and these include, but are not limited to, the following conjugated structures:

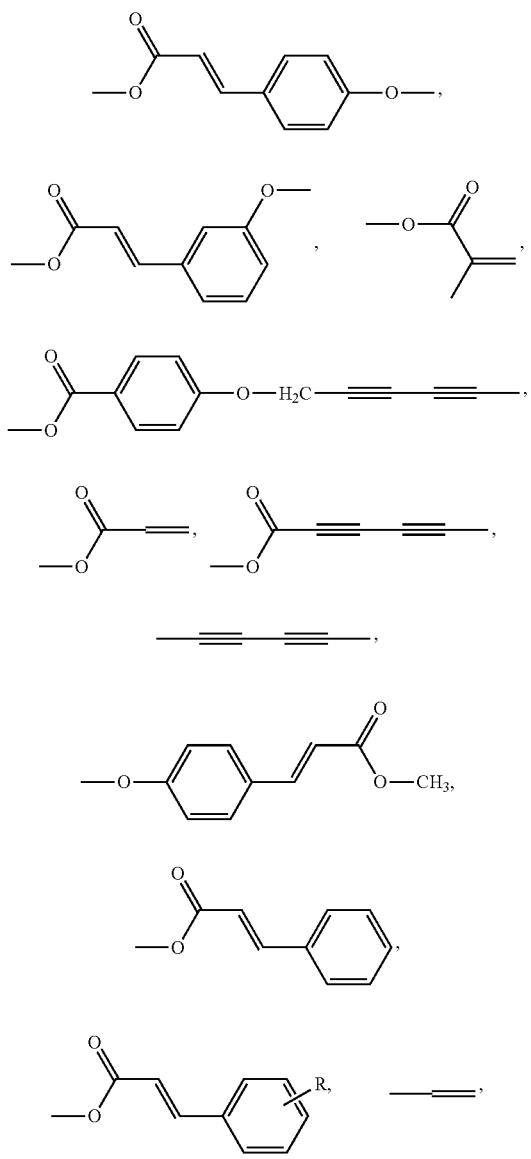

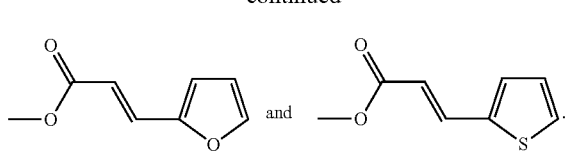 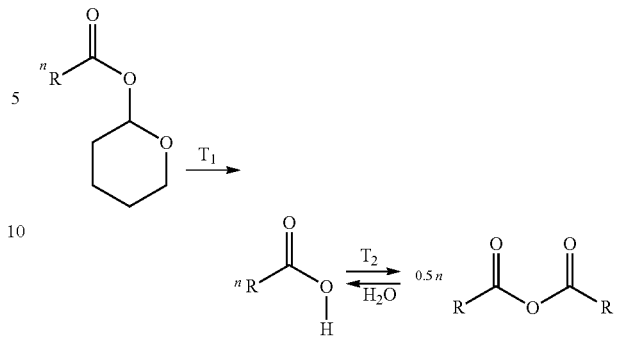

In some embodiments, the functional group, G, can be chosen such that, upon heating from the AFM tip, a protecting group is removed from the surface, leaving behind another functional group. For example, to obtain a carboxylic acid, G can be chosen form tert-butyl esters, tetrahydropyran esters, and the like. For an amine to result, G can include tetrahydropyranyl carbamates, amine N-oxides, and the like. If an alcohol or phenol is desired, G can be chosen from tetrahydropyranyl ethers, triphenylmethyl ethers, tetrahydropyranyl carbonate esters, and the like. When a thiol is desired after TCNL, G can include S-tert-butoxy carbonyls, S-tetrahydropyranyl carbonyls, ethyl disulfides, and the like.

In other cases, G can be a group that undergoes thermal polymerization and cross-linking reactions, including Diels-Alder reactions between two G groups (e.g., furans with maleimides, and the like), ring-opening polymerization (e.g., poly(ferrocenylsilanes) and the like), ring-opening metathesis polymerization (e.g., dicyclopentadiene, and the like), reactions to form conjugated polymers (e.g., from poly(phenylene-vinylene) or other like precursors), and reactions of trifluorovinyl ethers, for example. In still other situations, G can be a group that volatilizes or decomposes from the heat of the AFM tip.

As stated above, the polymer can have more than one functional group, G. These functional groups can be chosen such that each G is modified at the same or a different temperature.

In addition, the polymer can have a group, Y, which can be photochemically or thermally cross-linked to control the softening temperature of the overall polymer, now represented by $Y_n$-$P_n$-$G_n$. With the use of the Y group, the softening temperature can be tailored to be above or below the chemical modification temperature as desired. This can be accomplished by increasing or decreasing the glass transition temperature and/or the crystallinity of the polymer. The Y and G groups can be coupled to the polymer backbone through a side chain, and can be organized in blocks, which can be ordered or randomly oriented. The Y and G groups can derive from the same functional monomer unit or a different one. In some embodiments, the Y group can be chosen from cinnamate esters, chalcones, trifluorovinyl ethers, Diels-Alder reactants, or the like.

By way of illustration, specific polymers that can be used as the surface for undergoing TCNL is the following tehtrahydropyran—(THP) protected carboxylic acid-functionalized poly(acrylate):

This type of polymer, which is hydrophobic, can be thermally deprotected at about 120 degrees Celsius (° C.) to give a hydrophilic acid functionality. It will react further at about 170° C. to give a hydrophobic ahydride. This represents a surface that can undergo a so-called "read-write-overwrite process." It is important to note that the acid to anhydride conversion is reversible by the removal and addition of water, respectively.

Another polymer that can be used as the surface for undergoing TCNL is the following poly(amide):

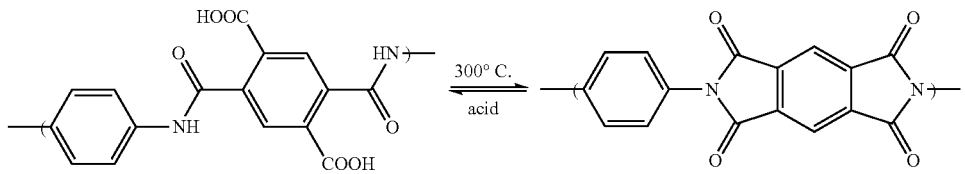

Here, the starting surface composition (i.e., the poly(amide)) is hydrophilic; but it can be modified into a hydrophobic poly(imide) at about 300° C. This reaction is reversible with addition of acid.

Still another polymer that can be used as the surface for undergoing TCNL is the following poly(imide):

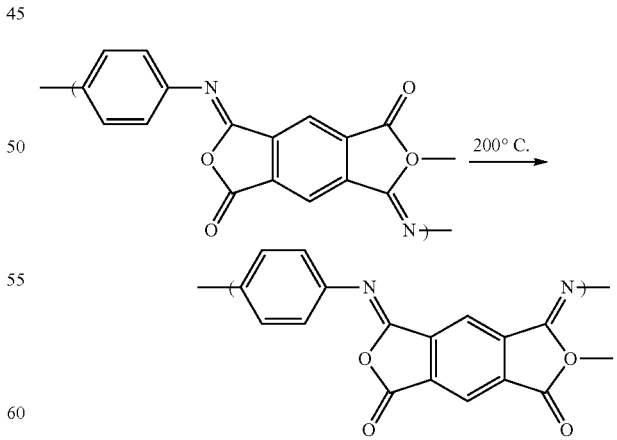

In this system, the solubility and polarity of the surface material is altered upon thermal treatment as the poly(imide) system undergoes a cis-/trans-isomerization.

Yet another polymer that can be used as the surface for undergoing TCNL is the following azobenzene:

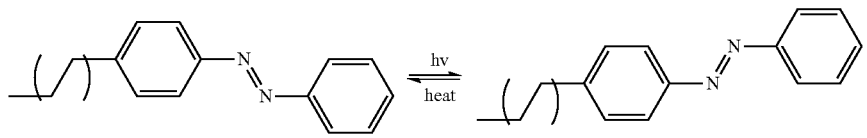

Here, the cis-/trans-isomerization will allow for a method of changing the local topology of the surface material. By first irradiating the surface with ultraviolet (UV) light, this azobenzene will be in the cis-form. It can be isomerized into the trans-form by local heating. Irradiation of the whole sample provides a means to "erase" the thermally-written modification.

Alternatively, the surface can be formed from a self-assembled monolayer or multilayer of molecules. The molecules can be represented by the basic structure $X_n$-R-$G_n$, wherein X represents an anchoring group for the molecule to attach to a substrate or platform, R represents a bridging group, G represents the functional group that will be modified by TCNL, and n is a positive integer. These molecules can be processed by standard self-assembled monolayer- or multilayer-forming techniques, which include a reaction between a thiol-terminated $X_n$-R-$G_n$ with a gold surface, silane-terminated $X_n$-R-$G_n$ with a glass surface, or like reaction.

In some embodiments, the anchoring group, X, can be chosen from phosphonic acids, phosphinic acids, sulfonic acids, carboxylic acids, carbamates, dithiocarbamates, thiols, selenols, phosphines, amines, amides, carbohydroximic acids, sulfonohydroxamic acids, phosphohydroxamic acids, monochlorosilanes, dichlorosilanes, trichlorosilanes, mono(alkoxy)silanes, di(alkoxy)silanes, tri(alkoxy)silanes, or the like, or a conjugate base of any of the foregoing; the bridging group, R, can be a linear or branched $C_3$ to $C_{50}$ aliphatic or cyclic aliphatic, fluoroalkyl, oligo(ethyleneglycol), aryl, amine, or like group; and G can be any of the functional group types discussed above for polymeric surfaces.

In other embodiments, the surface can be a precursor material to a desired composition. In this manner, rather than removing a functional group or changing a functional group, a conversion from the precursor to the desired composition can occur. This can involve a reduction, an oxidation, a molecular rearrangement, or other chemical reaction, which can be tuned not only by temperature, but also by the pressure and/or atmospheric environment.

For example, the surface can be formed form graphene oxide, and can be converted into reduced graphene oxide or even graphene. In another example for forming graphene, the precursor surface can be a silicon carbide surface.

Other compositions can be formed using this precursor conversion technique. In one illustration, the precursor surface can be a sol-gel comprising one or more metal alkoxide layers or a precursor sol-gel film, for example, of lead titanate (PT) or lead-zirconate-titanate (PZT). TCNL can be used to induce local nanopatterned pyrolysis and conversion of the precursor layer or film into a functional ceramic compound to create ceramic nanostructures.

Once modified, the surface can find use in an application calling for the improved property (e.g., elastic, mechanical, tribological, optical, wetting, adhesive, electrical, or chemical) or properties thereof. For example, a surface having a patterned series of pathways that are conductive (e.g., a conductive polymer, metal, graphene, or reduced graphene oxide), while the non-patterned (i.e., unmodified) portions of the surface are insulating can find use in electronic applications. In another example, a surface having patterned hydrophilic pathways, with the non-patterned portions of the surface being hydrophobic, can be used to fabricate a nanofluidic device. In still another example, a surface having patterned ferroelectric or piezoelectric domains (e.g., PT or PZT), while the non-patterned portions of the surface are non-polarizable, can be used in magnetic or electronic device applications.

Alternatively, the chemically-modified surface can serve as a template for creating chemical designs thereon and/or positioning other materials thereon. These designs and/or other materials can be placed on the modified portions of the surface, or they can be placed on the unmodified portions.

The types of other materials that can be placed on the surfaces include nanoscale objects, nanoscale anchors for microscale objects, or microscale objects themselves. These materials, regardless of their size, can vary from soft and compliant materials/objects (e.g., proteins, DNA, RNA, cells, and the like) to less compliant, stiff materials (e.g., nanotubes, fullerenes, nanoparticles, and the like). There are no constraints on the nature of the other materials as their attaching force may vary as desired. Such forces for attaching the additional material/object to the surface include covalent bonding, ionic bonding, hydrogen bonding, acid-base interactions, pi-stacking, arene-perfluoroarene interactions, Van der Waals forces, methods for molecular recognition (e.g., base pairing in nucleotides, host-guest coordination receptors, and other site-specific interactions), and the like. These objects can be attached directly to the surface or through a linker and/or expander molecule that is attached to the modified surface.

By way of illustration, one application of the TCNL-patterned surface as a template involves functionalization of the TCNL-modified portions of the surface, followed by attachment of a biological material to the surface based on the biological material's affinity for a the post-TCNL functional group. This procedure is desirable in situations where the biological material ordinarily would not attach to the TCNL-modified portions of the substrate. In this manner, the additional functionalization provides the ability for the biological material to attach to the surface in the same arrangement as was patterned thereon using TCNL.

If the biological material were single-stranded DNA or RNA, then the overall device (i.e., the surface with the DNA or RNA attached thereto) could be used as a so-called "master" for a supramolecular nanostamping process. Such processes are based on hybridization-contact-dehybridization cycles. That is, the complementary DNA or RNA strands will hybridize with the strands on the original master. If the complementary strands are 5' modified with chemical groups that can attach to a target second surface, which will be placed at an end opposite to the original TCNL-patterned surface, then the 5' modified ends will stick to the second surface, thereby forming a sandwich structure. By heating the sandwich structure, the hybridized DNA or RNA strands will dehybridize, leaving the original master (and the complementary device) available for further stamping.

The molecular recognition of such a process provides the ability to transfer large amounts of information in a single "printing" cycle. Conventional stamping techniques typically only print spatial information (i.e., size, shape, and position of features). In contrast, this process of TCNL with supramolecular nanostamping can allow for both spatial information from the pattern of the template, and chemical information from the DNA or RNA sequence of each anchored strand, to be transferred. In other implementations, this process can be used with other types of reversible molecular recognition reactions (e.g., receptor-receptor, antibody-antigen, and the like).

If more than one type of biological material were intended to be attached to the surface, then the TCNL-modified portions of the surface could be functionalized with more than one type of functional group such that each type of biological material had an affinity for a specific post-TCNL functional group. If, however, one type of biological material has an affinity for the TCNL-modified portions of the surface, then the number of functionalization steps could be decreased by one. Such a device can be beneficial for situations where more than one type of biological material is desired to interact with a particular sample (e.g., a cell study that require's interaction with two or more proteins).

EXAMPLES

The present disclosure is further exemplified by the following non-limiting examples.

Example 1

Synthesis of Poly((tetrahydropyran-2-yl N-(2-methacryloxyethyl)carbamate)-co-(methyl 4-(3-methacryloyloxypropoxy)cinnamate)) Polymer In this example; a new polymeric material, poly((tetrahydropyran-2-yl N-(2-methacryloxyethyl)carbamate)-co-(methyl 4-(3-methacryloyloxypropoxy)cinnamate)) was synthesized. This polymer had both a deprotecting group and a cross-linking group. The deprotecting group was the THP carbamate functionality, and the cross-linking group was the cinnamate functionality. The polymer has the following structure:

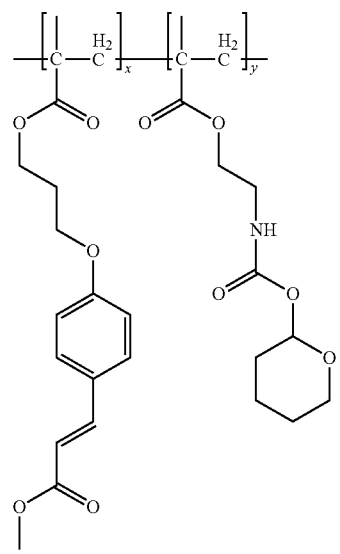

The polymer in this example was prepared using the following chemicals for the synthesis: dihydropyran (Aldrich), 2-isocyanatoethyl methacrylate (Aldrich), azobisisobutyronitrile (Aldrich), allyl bromide (Aldrich), potassium carbonate (VWR), platinum on activated carbon (10 wt %, Strem Chemicals), 4-hydroxybenzophenone (Alfa Aesar), and chlorodimethyl silane (Alfa Aesar). All solvents were reagent grade. All chemicals were used as-received with the exception of chlorodimethylsilane, which was distilled under nitrogen immediately before use.

The synthesis of tetrahydropyran-2-ol was carried out according to a literature procedure, as shown in the reaction scheme below. The $^1$H NMR spectrum was consistent with values reported in the literature.

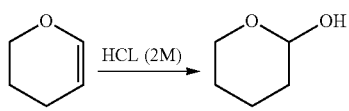 [SMILES: C1=COCCC1 ; OC1CCCCO1]

The synthesis of tetrahydropyran-2-yl N-(2-methacryloxyethyl)carbamate, which is schematically shown below, was carried out as follows: Tetrahydropyran-2-yl (2.80 mL, 28 mmol) was mixed with 2-isocyanatoethyl methacrylate (3.1 g, 20 mmol) and 1 drop of pyridine and stirred until the reaction was complete by $^1$H NMR. The resulting viscous mixture was purified by column chromatography on silica to yield a white powder (2.93 g, 57%).

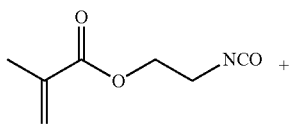

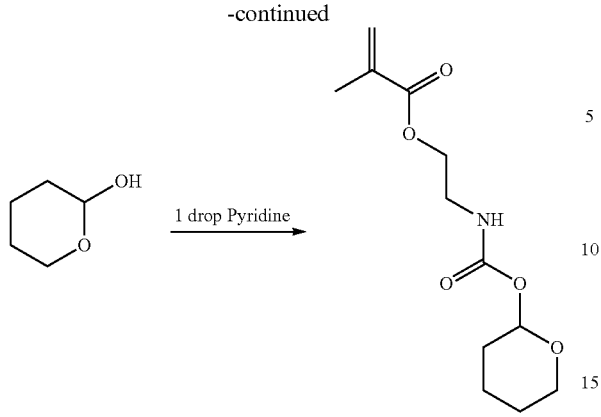

¹H-NMR (300 MHz, CDCl₃) data were as follows: δ (ppm) 6.09 (m, 1H), 5.9 (broad, 0.2H, minor conformer), 5.82 (broad, 0.8H, major conformer), 5.57 (apparent quint, J=1.5 Hz, 1H), 5.05 (broad, 0.8H, major conformer N—H), 4.83 (broad, 0.2H, minor conformer N—H), 4.21 (t, J=6 Hz, 2H), 3.86 (ABXY m, $J_{AB}$=11.5 Hz, $J_{AX}$=4.8 Hz, $J_{AY}$=5.1 Hz, 1H), 3.63 (ABXY m, $J_{AB}$=11.5 Hz, $f_{AX}$=8.6 Hz, $J_{AY}$=3.0 Hz, 1H), 3.49 (q, J=6 Hz, 2H), 1.91 (dd, J=1.5, 0.9 Hz, 3H), 1.77 (apparent dd, J=9.7, 2.7 Hz, 2H), 1.48-1.68 (m, 4H).

¹³C-NMR (75 MHz, CDCl₃) data were as follows: δ (ppm) 167.2, 155.0, 135.9, 126.0, 93.3, 63.5, 63.3, 40.0, 29.3, 24.8, 19.0, 18.2.

Elemental analysis (calculated, found for $C_{12}H_{19}NO_5$) revealed: C (56.02, 56.22), H (7.44, 7.36) N (5.44, 5.48).

The synthesis of methyl 4-(3-methacryloyloxypropoxy) cinnamate, which is schematically shown below, was carried out according to a literature procedure. ¹H NMR spectral features were consistent with reported values.

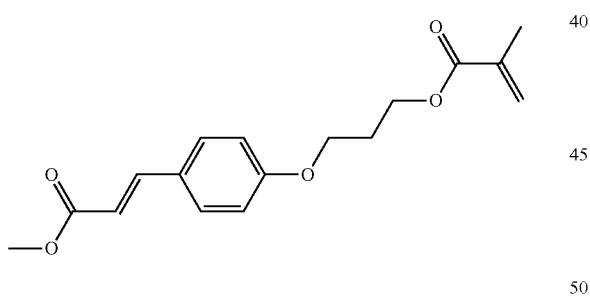

The synthesis of poly((tetrahydropyran-2-yl N-(2-methacryloxyethyl)carbamate)-co-(methyl 4-(3-methacryloyloxypropoxy)cinnamate)), which is schematically shown below, was carried out as follows: A mixture of tetrahydropyran-2-yl N-(2-methacryloxyethyl)carbamate (0.50 g, 1.9 mmol), methyl 4-(3-methacryloyloxypropoxy)cinnamate (0.15 g, 0.48 mmol), and azobisisobutyronitrile (AIBN) (2.0 mg, 0.012 mmol) in THF (6 mL) were added to a Schlenk ampoule using a Pasteur pipette. The flask was then freeze-pump-thawed a minimum of four times and the reaction mixture was heated at 60° C. for 20 h. Once the reaction mixture had returned to room temperature it was diluted with dichloromethane (30 mL) and added dropwise to hexanes (300 mL). The resulting precipitate was removed by vacuum filtration and dried under vacuum to yield a white powder (360 mg, 55%).

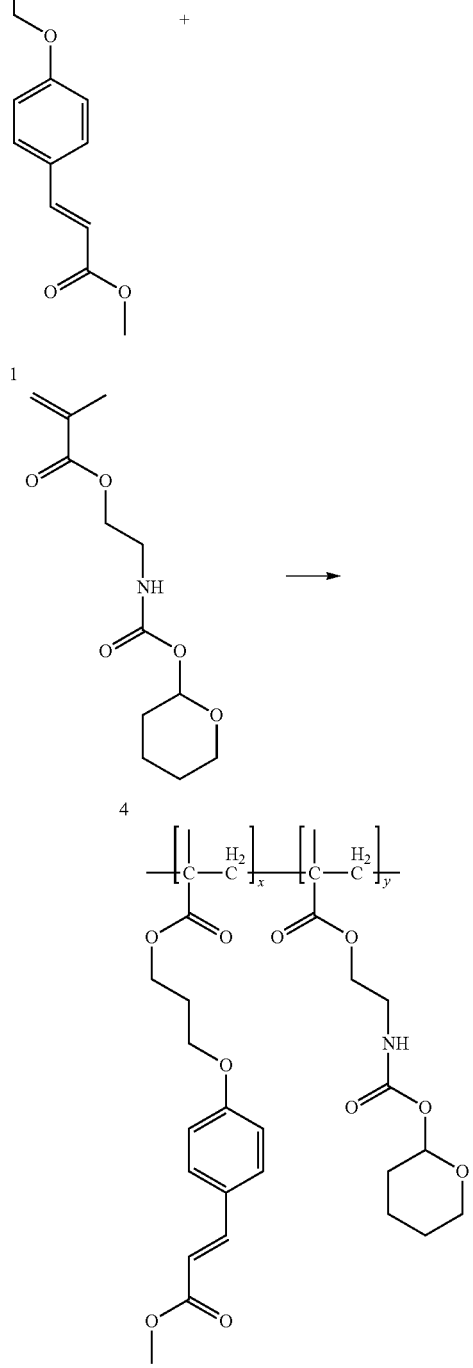

¹H-NMR (300 MHz, CDCl₃) data were as follows: δ (ppm) 7.6 (d broad, J=16.1 Hz, 1H), 7.5 (s broad, 2H), 6.9 (s broad, 2H), 6.3 (d broad, J=16.1 Hz, 1H), 5.7-6.0 (m broad, 5.2H), 3.3-4.2 (four apparent singlets broad, 27.2H), 0.7-2.1 (several m broad, 50.6H). The ¹H-NMR spectrum is reported as observed, with integration relative to the peak at 7.5 ppm (2H, due to aromatic protons in the cinnamate group). The N—H protons were not observed in the spectrum of the polymer.

$^{13}$C-NMR (75 MHz, CDCl$_3$) data were as follows: δ (ppm) 177.1, 167.8, 160.4, 155.3, 144.5, 129.8, 128.1, 127.8, 127.4, 127.2, 115.3, 114.8, 93.3, 63.6, 53.9, 51.6, 45.0, 44.7, 39.6, 39.5, 28.0, 25.0, 19.1, 17.4.

Elemental analysis (calculated, found for C$_{65}$H$_{96}$N$_4$O$_{25}$ (1:4 cinnamate:carbamate monomer ratio)) revealed: C (58.55, 57.83), H (7.26, 7.20), N (4.20, 4.12).

Example 2

TCNL of Multifunctional Templates for Assembling Nanoscale Objects

In this example, TCNL was used to thermally activate the deprotection of amine groups on a polymer surface in arbitrary nanoscale and microscale patterns at linear speeds of up to millimeters per second. The unmasked amine nanotemplates were then selectively and covalently functionalized to create patterns of thiols, maleimides, aldehydes or biotins in distinct areas of the polymer surface. The multiple functionalities of these patterns were exploited to create nanoarrays, with features as small as about 40 nm, of nanoscale objects such as bioactive proteins and DNA. By repeating the TCNL steps followed by different protocols for chemically converting the unprotected amines, it was possible to generate surfaces with orthogonal functionalities in distinct areas that were further functionalized at a later date. The bioactivity of the TCNL-designed protein arrays was confirmed by using fluorescent antibodies and a cell signaling experiment. Lastly; the relevance of tailored two-protein patterning was demonstrated for future biological studies. In particular, the cell adhesion protein ICAM-1 and the cell signaling protein anti-CD3 were independently assembled in concentric squares for future controlled studies of the spatial organization of the immunological synapse in T lymphocyte cells (T-cells).

The polymer surface in this example was that prepared in EXAMPLE 1. For a typical experiment, films of the polymer were prepared on glass slides pretreated with 4-(3-chlorodimethylsilyl)propoxy benzophenone, by spin-coating from a cyclohexanone solution. Specifically, several 75×25 square millimeter (mm$^2$) glass slides were cut into 25×25 mm$^2$ squares then cleaned with either piranha (75% concentrated H$_2$SO$_4$ and 25% of 30% H$_2$O$_2$ in water) or oxygen plasma. Each slide was placed in anhydrous toluene (about 50 mL) under argon and a solution of 4-(3-(chlorodimethylsilyl)propoxy)benzophenone in toluene (about 3 mL, about 0.28 M) was added along with five drops of anhydrous triethylamine. The slides were left in the solution overnight. The slides were then washed with chloroform then dried with N$_2$. The presence of the benzophenone was confirmed by measuring the water contact angle of the treated glass slides, which was found to be around 70°, consistent with literature values.

The films were then exposed to UV radiation to both covalently bind the film to the substrate through the benzophenone linker (about 352 nm irradiation) and to crosslink the polymer at the cinnamate moieties (about 300 nm irradiation). Films were prepared with thicknesses ranging from about 30 to about 150 nm, but most experiments were performed on films with a thickness of about 75±5 nm, as measured by a stylus profilometer.

TCNL and AFM characterization (e.g., imaging, friction, and phase measurements) were all carried out with the same AFM (Nanoscope Multimode IV, Veeco) using resistively heated cantilevers and commercial cantilevers (Nanosensor, SSS-NCHR) in air. Local chemical modifications were performed by scanning the sample with a thermal AFM probe heated at temperatures in the range of about 160 to about 240° C., in contact mode with normal loads in the range of about 20 to about 500 nano-Newtons (nN), at a speed varying between about 0.01 and about 2 mm/s. The temperature calibration of the thermal probes was performed using a known protocol.

Fluorescence microscopy imaging was performed using epi-fluorescence microscopy on an inverted Nikon TE2000 microscope equipped with a Nikon Intensilight (C-HGFIE) for illumination and a Nikon EM-CCD camera (DQC-FS). Images were obtained using a Plan Apo 60× water immersion objective (Nikon, NA 1.2) or a Plan Apo 100× oil immersion objective (Nikon, NA 1.4). Nikon filter cube sets were used to image fluorescent dyes in the UV region (#96310, UV-2EC DAPI filter set, excitation 340-380 nm, dichroic mirror DM400, emission 435-485 nm), in the green (#96320, FITC/GFP HyQ filter set, excitation 460-500 nm, dichroic mirror DM505, emission 510-560 nm), and in the red (#96324, Cy5 HQ filter set, excitation 620-660 nm, dichroic mirror DM Q660LP, emission 700-775 nm). The contrast in the different fluorescent images varies from figure to figure due to standard image processing. A detailed analysis of the homogeneity and contrast of the fluorescent patterns is beyond the scope of this work.

Cell Culture and Immunostaining experiments were performed as follows: Jurkat cells (clone E6-1, ATCC TIB-152) of passage 9 were maintained in Roswell Park Memorial Institute (RPMI)-1640 media with fetal bovine serum (FBS) (10%), L-glutamine (1%), non-essential amino acid solution (1%), sodium pyruvate (1%), and 4-(2-hydroxyethyl)-1-piperazineethanesulfonic acid (HEPES, 10 mM). The cell culture media and its components were obtained from Mediatech, Inc. The cells were maintained at about 37° C. in an about 5% CO$_2$ atmosphere. Jurkat cells were seeded on anti-CD3 patterned surfaces and incubated at about 37° C. and about 5% CO$_2$ for about 40 minutes in the media containing ICAM-1 (10 milligrams per milliliter (mg/mL)). To prepare the cells for staining, they were permeabilized in Triton X-100 (0.1%, EMD Chemicals) in paraformaldehyde (3%) for about 5 minutes, washed with phosphate-buffered saline (PBS), and incubated for about 30 minutes in paraformaldehyde (3%). Non-specific binding was blocked by incubation with bovine serum albumin (BSA) (1%, Calbiochem) in PBS for about 30 minutes. To label the PKC-u in the cells, polyclonal anti-PKC-u (BD Biosciences) was used as the primary antibody, and goat anti-Mouse IgG, FITC conjugate (Millipore) was used as the secondary antibody. The cells were mounted in elvanol before imaging.

Figure 3:
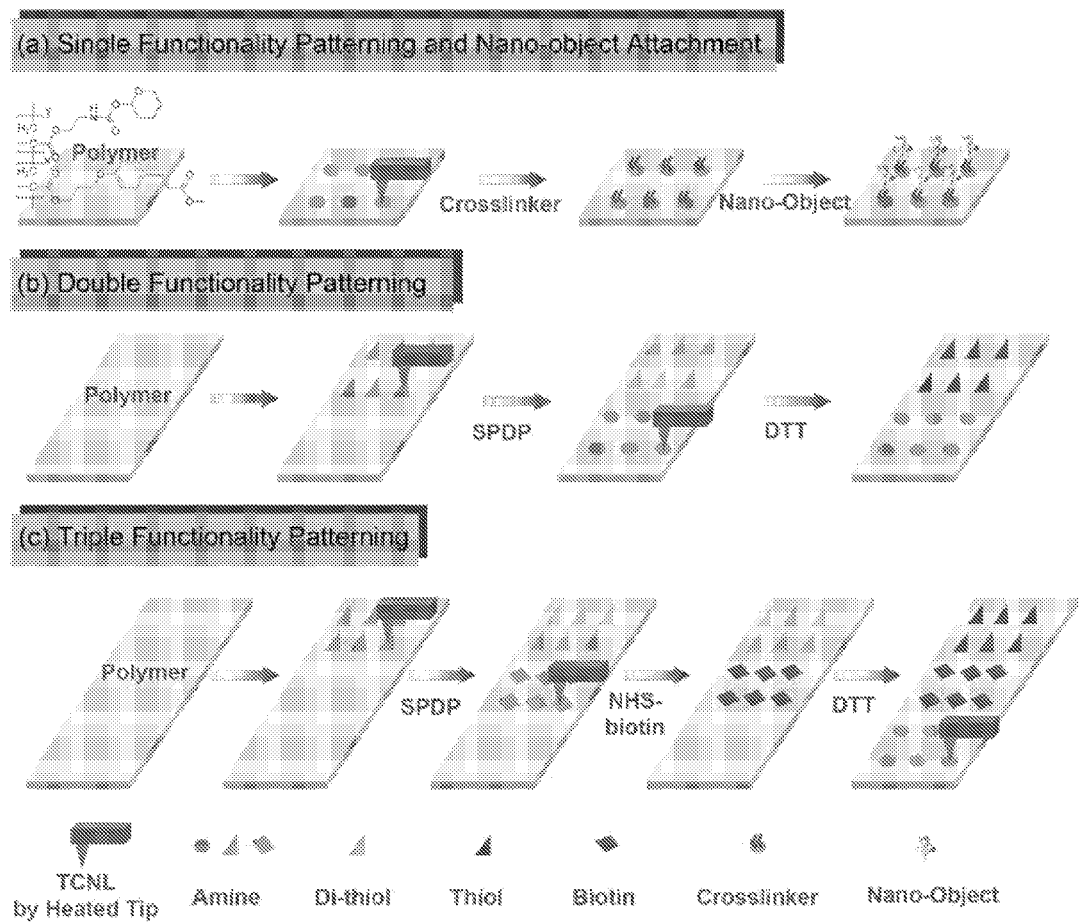
FIG. 3a is a schematic illustration of a process for creating a single nanoscale object pattern on a surface in accordance with some embodiments of the present invention.
FIG. 3b is a schematic illustration of a process for creating two functionalized patterns on a surface in accordance with some embodiments of the present invention.
FIG. 3c is a schematic illustration of a process for creating three functionalized patterns on a surface in accordance with some embodiments of the present invention.
Figure 4:
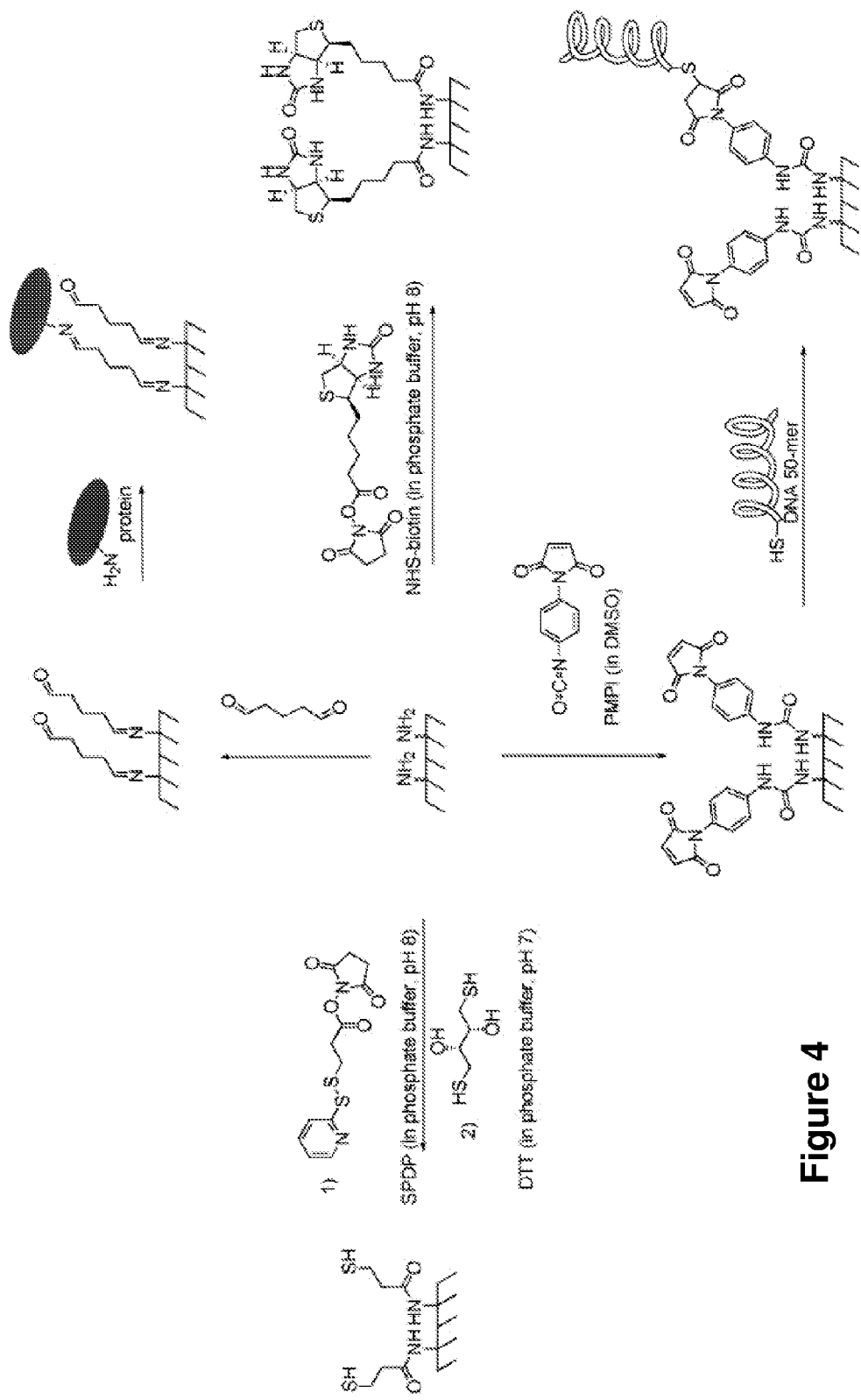
FIG. 4 is a process flow diagram illustrating how an amine functional group is selectively and covalently functionalized to create patterns of thiols, maleimides, aldehydes, and biotins on a polymer surface in accordance with some embodiments of the present invention.

TCNL was used on the polymer described above to enable the selective patterning of amine groups at linear speeds of up to millimeters per second. The THP carbamate groups of the polymer were thermally deprotected to unmask primary amines. The mass loss after bulk heating of the polymer above the deprotection temperature, $T_d$, was consistent with this mechanism. This deprotection was performed with a hot AFM tip maintained above $T_d$ (between about 150 and about 220° C.), thus exposing amine groups. This approach ultimately led to multifunctional nanopatterns coexisting on the same surface, which were subsequently, selectively functionalized with the desired species of nanoscale objects. The approach is outlined in FIG. 3. After using TCNL to write the first of the desired amine patterns, the amines were thiolated via a reaction with N-succinimidyl 3-(2-pyridyldithio)propionate (SPDP) (triangles, FIGS. 3b and 3c). A second TCNL pattern was then created on a different area of the same polymer surface (diamonds, FIGS. 3b and 3c), exposing additional amines in a new region. The dithiols obtained after the first functionalization step were then reduced to thiols using dithiothreitol (DTT), thereby producing a surface with tailored patterns of amine and thiol groups (FIG. 3b). This functionalization scheme is shown in the process flow diagram of FIG. 4.

Alternately, the amine pattern was transformed from the second application of TCNL using N-hydroxysuccinimide (NHS)-biotin, thus modifying the amine functionality to a biotin functionality (FIG. 3c). At this stage, reduction with DTT created a co-patterned surface of thiols and biotins. In order to nanopatterns surfaces with three different functionalities, a third application of TCNL was used to produce a triple-patterned surface consisting of thiols, biotins, and amines (FIG. 3c).

Once the surfaces were patterned with the desired chemical groups, they were stored in a desiccator for later functionalization with proteins or other nanoscale objects. In this example, the nanopatterned surfaces were stored for about three weeks before successful two-protein functionalization. Longer storage times, however, should be possible.

Figure 5:
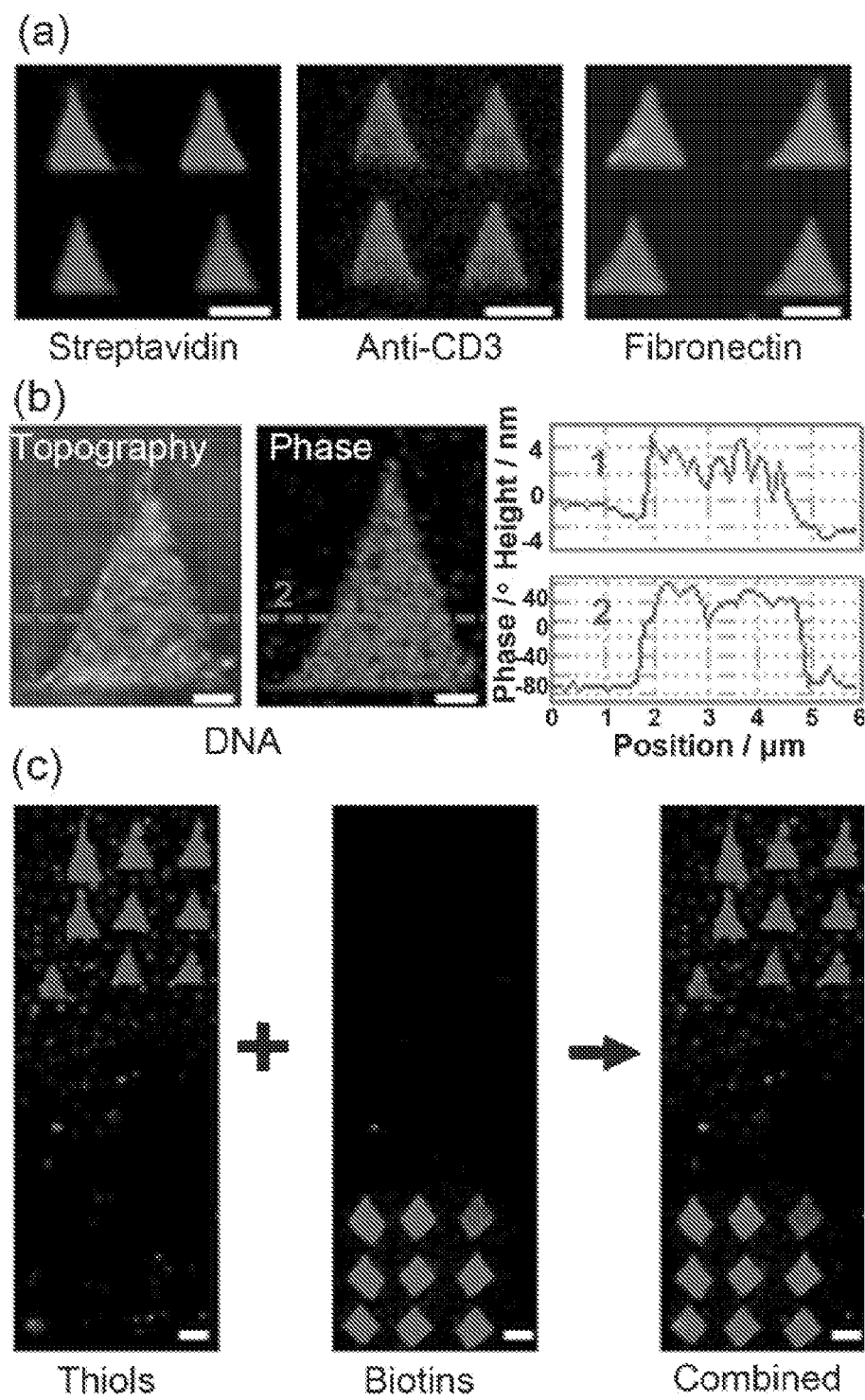
FIG. 5a illustrates epi-fluorescence images of patterns of Cy5-streptavadin cross-linked to an amine via NHS-biotin, biotinylated Alexa350-antiCD3 cross-linked to NHS-biotinylated amine with streptavadin, and Atto488 fibronectin cross-linked to amine with glutaraldehyde (GA) with scale bars of 5 micrometers in accordance with some embodiments of the present invention.
FIG. 5b illustrates AFM topography and phase images of a triangular pattern of thiol-terminated single-strand DNA cross-linked to amines through N-(p-maleimidophenyl)isocyanate (PMPI) with scale bars of 1 micrometer in accordance with some embodiments of the present invention.
FIG. 5c illustrates epi-fluorescence images of orthogonal functionality patterns of N-(7-dimethylamino-4-methylcoumarin-3-yl) maleimide (DACM) cross-linked to amine-terminated triangles by means of N-succinimidyl 3-(2-pyridyldithio)propionate (SPDP) and dithiothreitol (DTT) thiolation and patterns of Cy5-streptavadin cross-linked to an amine-terminated triangles via NHS-biotin with scale bars of 10 micrometers in accordance with some embodiments of the present invention.

The viability of single and multiplexed patterns will now be discussed. Several characterization techniques provided evidence that reactive amines were created by local thermal deprotection. A first confirmation of the chemical modification by TCNL was obtained in situ by friction force microscopy, indicating a regular increase in friction in the areas heated by the tip. This friction increase was consistent with a decrease of the water contact angle (larger hydrophilicity) when the copolymer film was bulk heated above $T_d$. No chemical transformation was observed if the tip temperature during patterning was below $T_d$. Direct confirmation of the chemical viability of the surfaces is shown in FIG. 5.

Using several amine cross-linking strategies, TCNL patterns were functionalized with small molecules, proteins, or other nanoscale objects that can selectively interact with the underlying amine pattern, but not with the unmodified polymer. Specifically, FIG. 5a shows the binding of different fluorescently labeled proteins to the TCNL amine patterns via two different crosslinking mechanisms, NHS-biotin and glutaraldehyde (GA). The fluorescent patterns of single protein species in FIG. 5a show bound streptavidin, anti-CD3, and fibronectin. Images produced using epi-fluorescence microscopy verified that fluorescent patterns were consistent with the patterns written by TCNL and with the post-patterning functionalization utilized. To provide a simple demonstration of the generality of the approach, FIG. 3b shows AFM images of a TCNL-generated triangular amine pattern that was functionalized with 50-mer single-stranded (ss)DNA. The surface amines were converted to maleimides via N-(p-maleimidophenyl)isocyanate (PMPI) in dimethylsulfoxide, and then cross-linked to thiol-terminated DNA strands. The AFM topography and phase images of the patterns before and after DNA functionalization were consistent with the binding of DNA in the TCNL-activated triangular area. The observed height contrast of about 5 nm was also consistent with previous work on DNA patterning where, for 37-mer ssDNA, the patterns showed height contrast of about 4 nm. We note that for this particular triangular pattern, the depletion height in the active area (excluding the edges) written by TCNL before DNA functionalization was about 1 nm.

The viability of multifunctional patterns was then verified using the approach described in FIG. 3. A co-pattern of thiols and biotins was fluorescently labeled by incubation of the surface first with the blue fluorescent dye N-(7-dimethylamino-4-methylcoumarin-3-yl) maleimide (DACM) and then the red-emitting Cy5-streptavidin, in order to determine if they would selectively bind to the thiol and biotin patterns, respectively. FIG. 5c shows the resultant fluorescent patterns of thiols (triangles) and biotins (diamonds). The two fluorophores were imaged separately on a monochrome camera using a DAPI filter set for the DACM and a Cy5 filter set for the Cy5-streptavidin. The third combined image represents the overlay of the two independently acquired images. Limited crosstalk was observed between the two channels, demonstrating both the effective localization of the dyes onto the TCNL pattern and the specificity of their chemical crosslinking to the surface.

Minimal nonspecific background was apparent on the nontreated polymer areas. Preliminary studies were performed to quantify the degree of nonspecific protein binding to nonpatterned areas of the polymer.

The fabrication and characterization of protein nano-arrays will now be discussed. TCNL was capable of extremely high resolution chemical patterning of surfaces due to the high temperature gradients in the vicinity of the heated tip. Therefore, the ability to organize small amounts of proteins with high definition was investigated. Using a single touchdown approach at each feature, an array of 500 nm features decorated with fluorescently labeled fibronectin was produced. The size of a single feature was inferred from AFM imaging of the protein pattern. To investigate length scales below the resolution limit of optical microscopy, topographical and phase AFM imaging were employed in ambient conditions. Using again a single touchdown approach at each feature but with a shorter dwell time, TCNL was used to deprotect amines in even smaller areas. AFM phase images provide information on the local viscoelasticity of the sample. The topography indicated a shallow indentation of approximately 10 nm. This depth could be made larger or smaller by varying the tip temperature, load, and dwell time. The surface was then functionalized with fibronectin or with streptavidin. The topographical data revealed that the TCNL holes were filled with proteins. The phase images were also consistent with the deposition of proteins in the holes. Fibronectin phase features as small as 40 nm and streptavidin as small as 60 nm were measured. The former value compared well with previous measurements of single dry fibronectin molecules. Comparing the topographical image of the active sites before and after fibronectin functionalization, and considering the geometrical convolution with a spherical AFM tip (radius about 15 nm), it was concluded that roughly 1 to 2 fibronectin molecules were exposed at the surface, whereas more fibronectins could fit inside the hole created during TCNL writing. More detailed information on the exact numbers of proteins per spot is not available because the conformation of the proteins inside the holes was not known.

The formation and characterization of bioactive two-protein patterns will now be discussed. In complex molecular systems, proteins work cooperatively to initiate biological events, for example in the adhesion plaque formed during cell adhesion or the patterning of signaling and adhesion proteins in the formation of the T-cell immunological synapse. Here it was shown that patterned proteins remained bioactive and could initiate cell activity. A method to nanopattern two proteins on a surface with independent and arbitrary designs was demonstrated.

Figure 6:
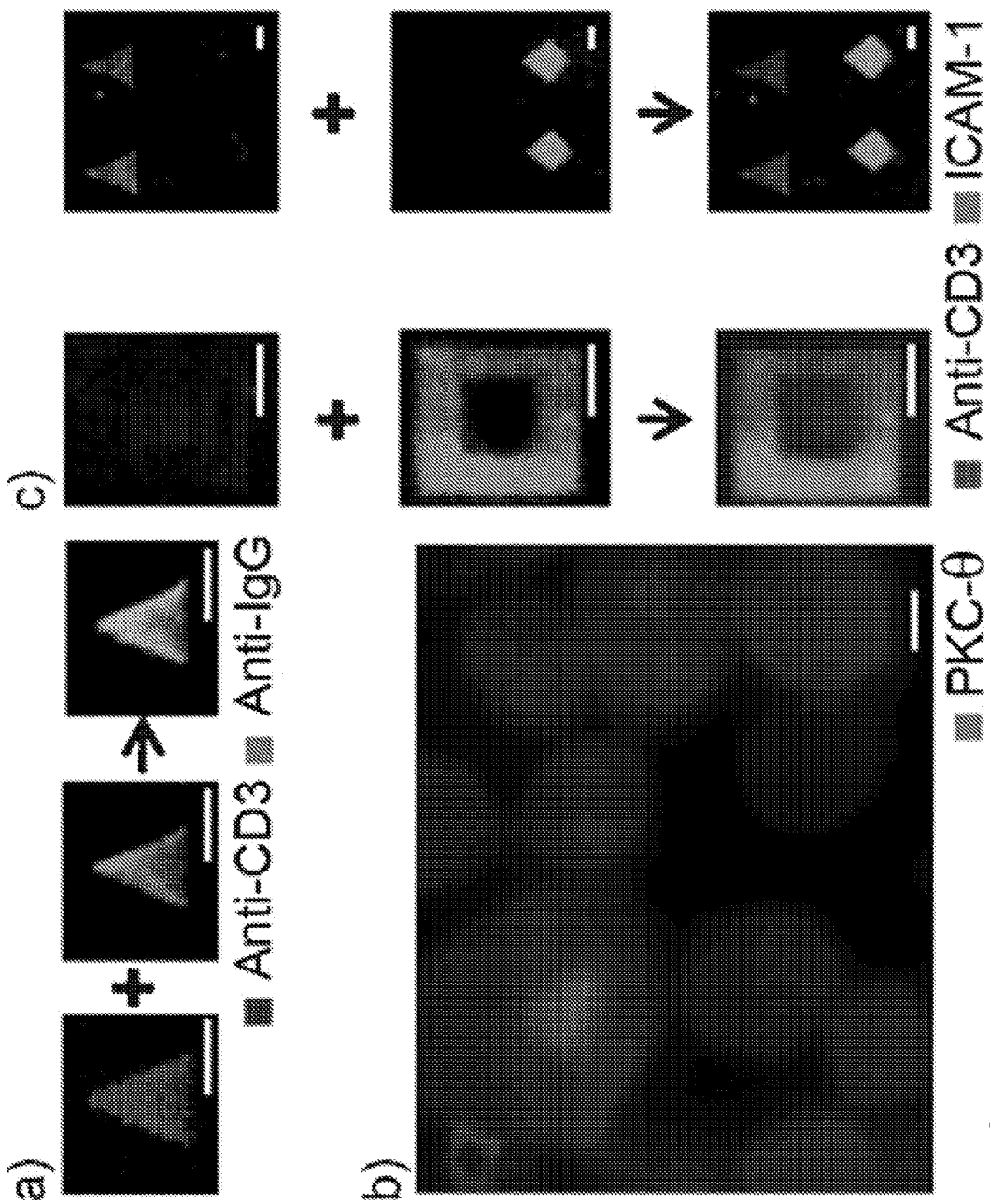
FIG. 6 illustrates epi-fluorescence images of anti-CD3 bioactivity and two-protein co-patterning with scale bars of 5 micrometers in accordance with some embodiments of the present invention. Specifically.

Maintaining the bioactivity of surface-patterned proteins is crucial for most applications. However, many potential protein patterning techniques do not provide ideal conditions for preserving bioactivity. FIG. 6a demonstrates the bioactivity of the biotin-bound anti-CD3. The ability of anti-CD3 (triangle) to bind a secondary antibody, anti-IgG (triangle), was verified. In a separate bioactivity study, it was also found that GA-bound intracellular adhesion molecule-1 (ICAM-1) binds specifically to anti-ICAM-1. Anti-CD3 is known to stimulate specific cell signaling pathways when interacting with Jurkat cells, an immortalized line of T-cell that are used to investigate T-cell signaling and immune synapse formation. In a cellular assay to demonstrate the bioactivity of bound anti-CD3, spatial correlation of protein kinase C-u (PKC-u) inside a T-cell interacting with the underlying anti-CD3 pattern was specifically sought. Immunofluorescence cell staining of PKC-u in a cell interacting with a triangle-shaped anti-CD3 micropattern (FIG. 6b) showed the halo of the PKC-u echoing the triangular shape of the anti-CD3 micropattern. Thus, both molecular and cellular evidence exists for the preserved bioactivity of TCNL patterned proteins.

To construct a single surface with two co-existing but independently immobilized protein species, the basic strategy presented in FIG. 3 was followed. FIG. 6c shows a concentric set of protein squares (inner=anti-CD3, outer=ICAM-1) and a separate surface patterned with a 2×2 array comprised of two anti-CD3 triangles and of two ICAM-1 diamonds. The top row in FIG. 6c shows the bound anti-CD3 in the center of the concentric pattern and on the triangles. The middle row shows the bound ICAM-1 on the outer part of the concentric square pattern and in the diamonds. The bottom row consists of the combined fluorescent images. Minimal crosstalk and nonspecific binding to the untreated polymer surface was present.

In conclusion, this example has shown the use of TCNL to produce nanopatterns of amines on a polymer surface, at linear speeds of up to millimeters per second. The amine groups were then further converted to aldehydes, thiols, biotins, and maleimides, and were used, in a second stage, to attach different classes of nanoscale objects (e.g., proteins and nucleic acids) by standard functionalization methods. This new TCNL/covalent functionalization (CF)/molecular recognition (MR) approach was conceptually straightforward and, with the current generation of materials, patterns can be written at high resolution (at least 40 nm), and has the potential to be massively parallelized, which would enable patterning of large areas (larger than 100 cm$^2$) at speeds up to one meter per second. While the technique was demonstrated by using glass substrates, since the polymer can planarize a substrate, the technique can be applicable to any oxide surface to which the polymer can be cross-linked.

Furthermore, the surfaces were pre-patterned and stored for three weeks for later bio/nano-functionalization. This offers the advantage that multiprotein/nanoscale object patterning can take place under native conditions in a second laboratory without the TCNL equipment or expertise in nanolithography. These features can increase the accessibility of the technique to a variety of researchers not only interested in nanolithography, but in areas of biochemistry, nanoscience, and nanobiotechnology. The TCNL/CF/MR can have a direct impact on the development of nanoscale devices and biosensors, and on many cell studies that require interaction with two or more proteins in tailor-made patterns.

Example 3

Direct TCNL Patterning and Characterization of Poly(p-Phenylene Vinylene) Nanostructures In this example, TCNL was used to prepare poly(p-phenylene vinylene) (PPV), which is a widely studied electroluminescent conjugated polymer. Direct writing of PPV by locally heating a sulfonium salt precursor was achieved with sub-100 nm spatial resolution in ambient conditions. The local thermochemical conversion was verified by Raman spectroscopy, fluorescence imaging, and atomic force microscopy. This convenient direct writing of conjugated polymer nanostructures could be desirable for the design and fabrication of future nanoelectronic, nanophotonic, and biosensing devices.

A solution of a sulfonium salt precursor, poly(p-xylene tetrahydrothiophenium chloride) (0.25 wt % in H$_2$O, Aldrich), was drop cast on either glass slides or Si (111) wafers that had been immersed overnight in a piranha solution. The thermal conversion to PPV typically involves the elimination of both thiophene and hydrogen chloride in inert gas conditions or in vacuum at heating temperatures in the range of 250-300° C. Here, however, TCNL was used to produce the PPV with the AFM tip at about 240° C. The TCNL process for producing PPV patterns in the precursor film's surface is schematically shown in FIG. 7a.

Ultrasharp tapping mode AFM tips (SSS-NCHR, Nanosensors) were used to acquire high resolution topographical images of the PPV nanostructures written by TCNL.

Fluorescence imaging is a convenient method to follow the thermal conversion of a precursor to PPV because of its broad emissive photoluminescence spectrum in the green color region. PPV nanostructures were imaged using fluorescence microscopy with an inverted Nikon TE2000 equipped with a high-sensitivity charge coupled device camera (Cool-SNAP HQ2, Roper Scientific). Images were obtained using a Plan Apo 60× water immersion objective (Nikon, NA 1.2). A Nikon filter cube set was used to image fluorescent PPV nanostructures in the green region (#96320, FITC/GFP HyQ filter set, excitation at about 460 to about 500 nm, dichroic mirror DM505, and emission at about 510 to about 560 nm). All of the Raman data of the present work were obtained from a confocal Raman microscope (Jobin Yvon HR800) using a laser excitation wavelength of about 785 nm with the same acquisition time.

Figure 7:
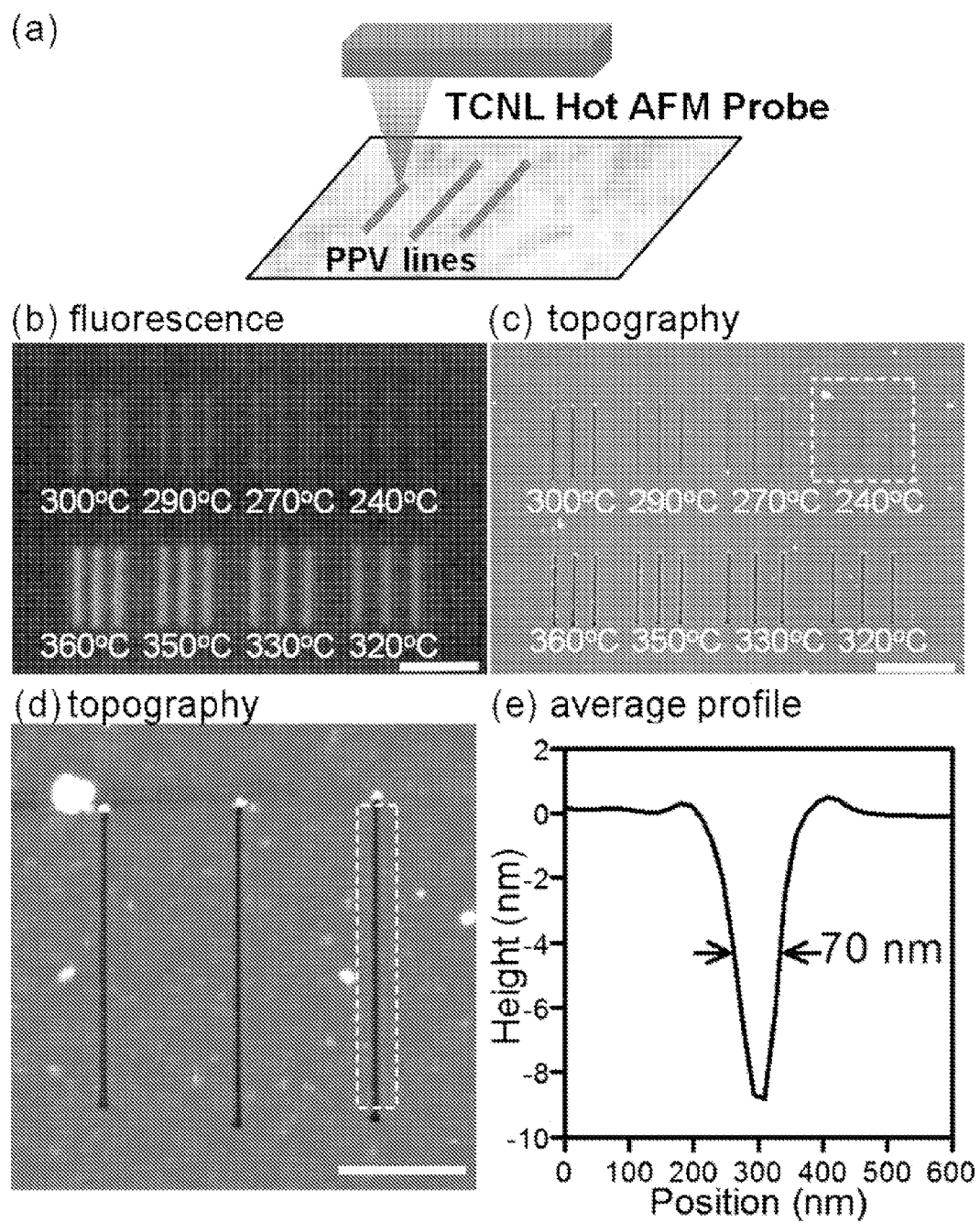
FIG. 7a is a schematic illustration of a TCNL process for fabricating poly(p-phenylene vinylene) (PPV) nanostructures in accordance with some embodiments of the present invention.
FIG. 7b provides fluorescence images of PPV nanostructures made by TCNL at a range of temperatures between about 240 and about 360 degrees Celsius (° C.), with a scale bar of 5 micrometers, in accordance with some embodiments of the present invention.
FIG. 7c provides AFM topography images of PPV nanostructures made by TCNL at a range of temperatures between about 240 and about 360° C., with a scale bar of 5 micrometers, in accordance with some embodiments of the present invention.
FIG. 7d is an enlarged view of the PPV nanostructures made by TCNL at 240° C. of FIG. 7c with a scale bar of 2 micrometers.
FIG. 7e is a graph showing that the average profile of the PPV nanostructures shown in FIG. 7d has a line width (full width at half maximum) of about 70 nanometers.

FIG. 7 shows fluorescence and AFM topography images of the PPV lines made by TCNL. These nanostructures were made at a writing speed of about 20 µm/s, with a normal load of about 30 nN, and cantilever temperature ranging between about 240 and about 360° C. The nanostructures started to show a visible fluorescent contrast at about 240° C. The contrast became clearer as the heating temperature was raised to about 360° C. The corresponding AFM topography images (FIGS. 7c and 7d) reveal the capability of TCNL to fabricate PPV nanostructures with a high spatial resolution of about 70 nm.

Figure 8:
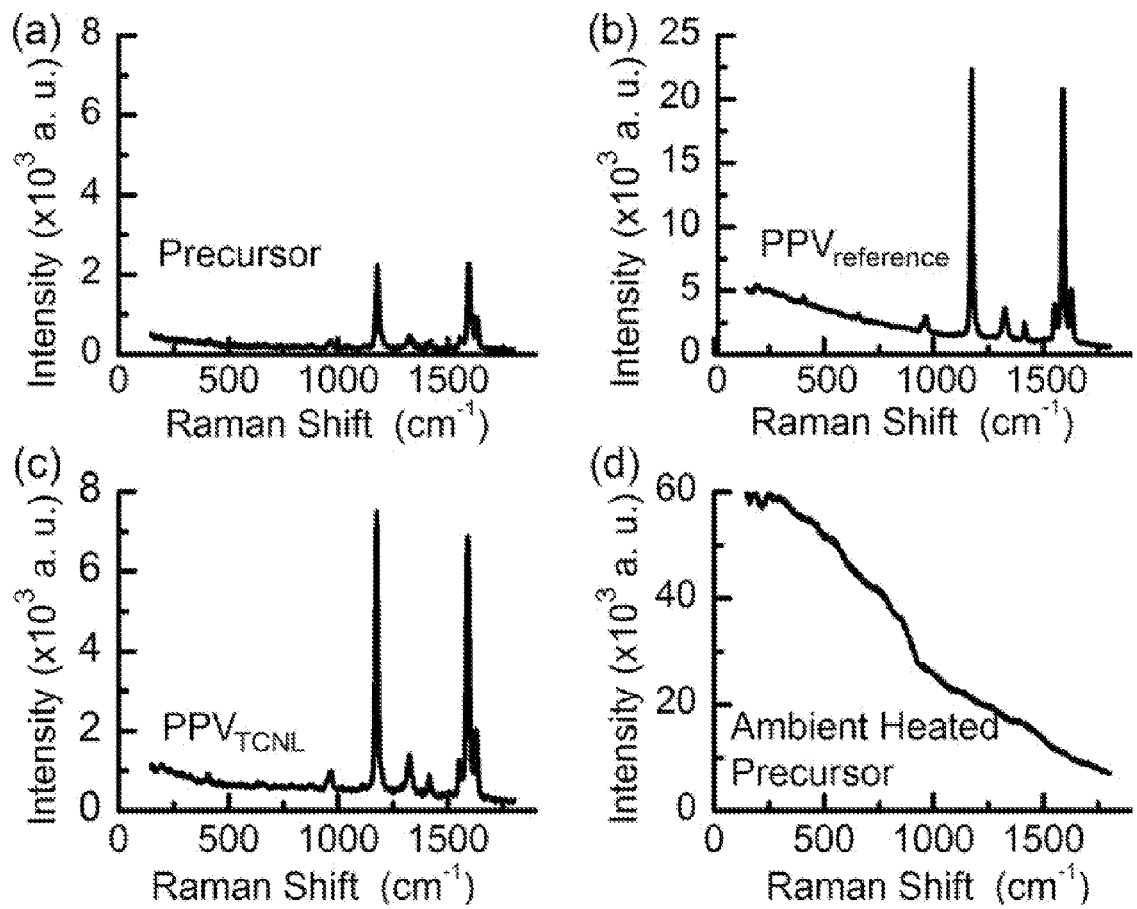
FIG. 8 provides Raman spectra in accordance with some embodiments of the present invention of (a) an untreated PPV precursor, (b) a PPV reference sample, (c) a TCNL-produced PPV pattern, and (d) the untreated PPV precursor annealed under ambient conditions.

Raman spectroscopy measurements provided more definitive evidence of the thermal conversion and highlighted the quality of the TCNL-prepared nanostructures. 20×20 square micrometer (µm$^2$) TCNL patterns at about 240, about 280, and about 320° C., with a normal load of about 30 nN and a speed of about 20 µm/s. Raman measurements revealed that the quality of the PPV patterns formed by TCNL in ambient conditions was comparable to the quality of a PPV sample prepared by a standard thermal annealing of a precursor polymer under vacuum, herein referred to as PPV$_{reference}$. Raman spectra were obtained from four representative samples: an untreated precursor film (FIG. 8a), a PPV$_{reference}$ film (FIG. 8b), a TCNL pattern (FIG. 8c), and a precursor film bulk heated with a hot plate in air at about 280° C. for about an hour (FIG. 8d). The four samples were obtained from the same precursor polymer batch and had a thickness of about 1.4 µm. The PPV$_{reference}$ film was prepared by annealing the precursor film for about five hours at about 280° C. in a vacuum of about 200 milliTorr. The most distinctive characteristic of the Raman spectra after the complete conversion of the precursor film into PPV was the large intensity enhancement [compare FIGS. 8a and 8b], which were attributed to a density increase in the polymer film due to a volume contraction. The Raman spectrum of the TCNL pattern in FIG. 8c clearly shows the same enhancement in intensity throughout the spectrum. In the case of an ambient bulk heated precursor polymer, for which the Raman spectrum is shown in FIG. 8d, a large continuum background very likely generated by oxidation and the disappearance of the PPV Raman peaks were observed.

Figure 9:
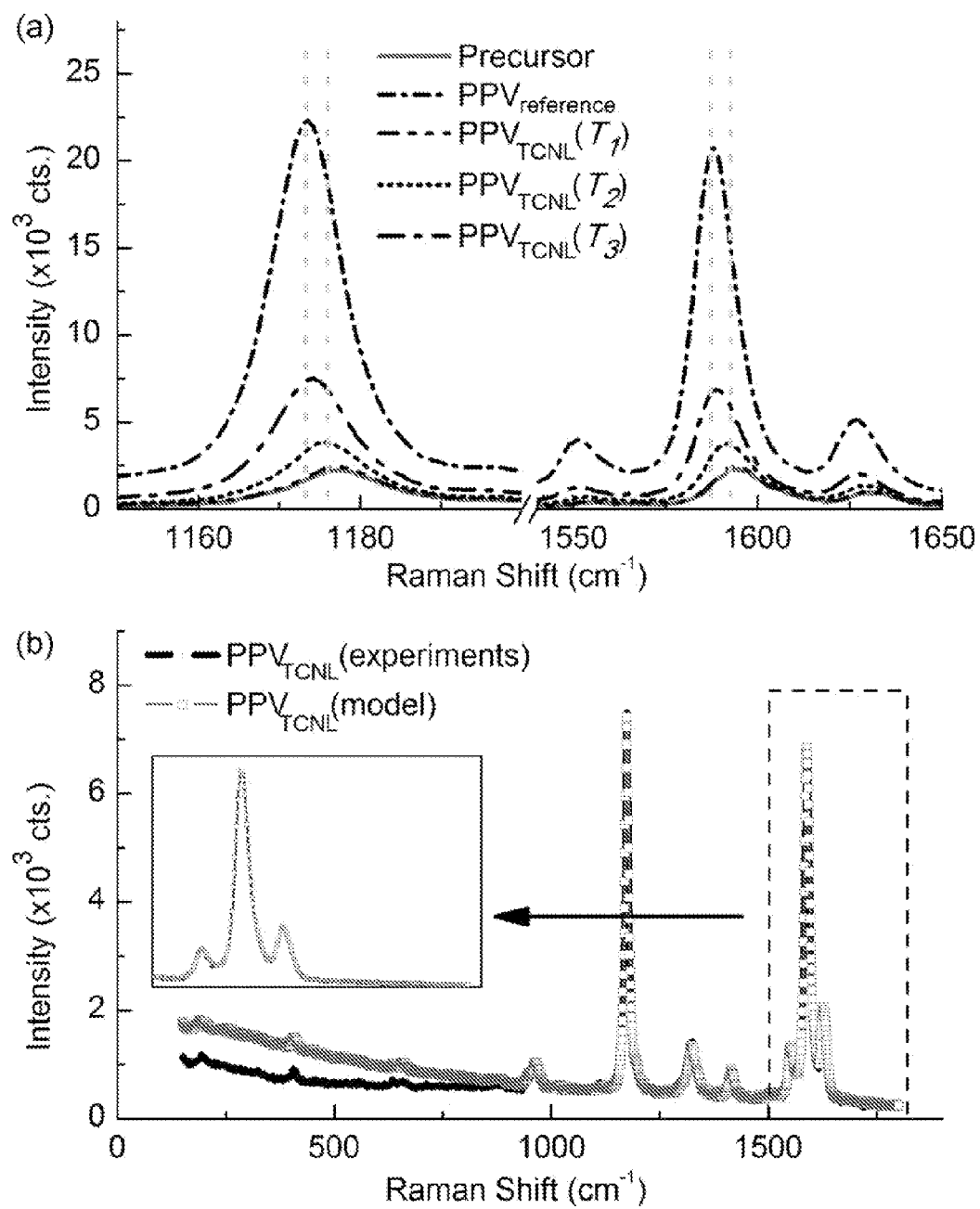
FIG. 9a illustrates Raman spectra of PPV samples as a function of temperature used during TCNL, wherein $T_1$ is about 240° C., $T_2$ is about 280° C., and $T_3$ is about 320° C. in accordance with some embodiments of the present invention.
FIG. 9b illustrates a comparison between the Raman spectrum obtained from a PPV sample produced by TCNL at about 300° C. and the Raman spectrum obtained from Equation 1 of Example 2, showing that the continuum background is much lower in the TCNL sample than in the vacuum annealed sample of the model.

Another signature of the precursor-PPV conversion is the shift in frequency of the Raman peaks associated with the C-C vibrations to lower frequencies. With respect to the $PPV_{reference}$, the two Raman peaks of the untreated precursor polymer at around 1178 and 1594 cm$^{-1}$ are found to shift by about 3 and about 6 cm$^{-1}$, respectively, after the conversion, as depicted in FIG. 9a. The Raman peak positions of the TCNL patterns written at three different tip temperatures were in between those of the precursor polymer and those of the $PPV_{reference}$ polymer. As the AFM tip temperature used to perform TCNL increased, the Raman intensity of the written patterns increased and the peak positions shifted to those of the $PPV_{reference}$ film.

In order to obtain more quantitative information on the quality and degree of thermochemical conversion, the TCNL modified film as composed of a % of precursor polymer and (100−α) % of $PPV_{reference}$ was modeled. The Raman spectrum of the composite system may thus be a linear superposition of the spectra of the two constituents, namely precursor and $PPV_{reference}$ [shown in FIGS. 8a and 8b, respectively], as estimated by the following relationship:

$$I_{PPV_{TCNL}}^{Model} = \frac{\alpha}{100} \times (I_{precursor} - I_{substrate}) + \left(1 - \frac{\alpha}{100}\right) \times (I_{PPVreference} - I_{substrate}). \quad (1)$$

FIG. 9b illustrates the Raman spectra obtained from the TCNL pattern produced at about 300° C. ($I_{PPV_{TCNL}}^{Experiment}$) and $I_{PPV_{TCNL}}^{Model}$ derived from Equation (1). The free fitting parameter α was found by fitting $I_{PPV_{TCNL}}^{Model}$ to $I_{PPV_{TCNL}}^{Experiment}$ in the range of about 1500 to about 1800 cm$^{-1}$. This spectral region is far off the background signal caused by oxidation. With the blending ratio of 27% $PPV_{reference}$ and 73% precursor, the peak frequencies and intensity of $I_{PPV_{TCNL}}^{Model}$ were found to be perfectly overlapping in both intensity and peak-positions with $I_{PPV_{TCNL}}^{Experiment}$ in the considered frequency range. However, the broad background signal persistent at the head side was very different in the two cases. It is believed that this persistent difference could arise from partial oxidation of the $PPV_{reference}$ sample. In comparison with $PPV_{reference}$, the TCNL samples exhibited a smaller background intensity at low frequencies, which suggests that the TCNL method may produce higher quality PPV samples. This improvement was attributed to the TCNL-specific geometry in which the temperature was increased locally at the tip-surface "sealed" contact. By using the above-found parameter, α=73%, it was estimated that out of the about 1.4 μm thick precursor film, a precursor thickness of about 320 nm was converted to the reference grade of PPV in a single application of TCNL at about 320° C. This thickness can be controlled by changing the tip temperature and contact time, which is an advantage of the TCNL process.

In summary, PPV nanostructures were made by TCNL, where PPV nanostructures were formed from a sulfonium salt precursor polymer by the thermal conversion in ambient conditions. The successful PPV conversion was verified by both Raman spectroscopy and fluorescence imaging. Furthermore, the dimensions and thicknesses of the nanostructures were controlled easily by varying the tip position and temperature. The resolution of the written nanostructures can be further improved by decreasing the thickness of the precursor film. This nanopatterning of a conjugated polymer, when massively parallelized, could facilitate the design and fabrications of future nanoelectronic, nanophotonic, and biosensing devices.

Example 4

TCNL of Graphene Oxide to Produce Reduced Graphene Oxide

The reduced form of graphene oxide (GO) is an attractive alternative to graphene for producing large-scale flexible conductors and for creating devices that require an electronic gap. This example illustrates a means to tune the topographical and electrical properties of reduced GO (rGO) with nanoscopic resolution by local thermal reduction of GO using TCNL. The rGO regions were up to four orders of magnitude more conductive than pristine GO. Variably conductive nanoribbons with dimensions up to 20 μm and down to about 12 nm were produced in oxidized epitaxial graphene films in a single step that was clean, rapid and reliable. Further, GO was converted to rGO with a 100% yield in dozens of structures patterned on random locations in the GO film. No sign of AFM tip wear or sample tearing was observed, indicating that the "carbon skeleton" was continuous across the GO/rGO junctions.

TCNL was performed by using a heated atomic force microscope probe tip to reduce selected regions of both single layers of isolated GO and large-area GO films formed by on-chip oxidation of epitaxial graphene oxide ($GO_{epi}$) grown on SiC. TCNL reduction of GO was verified by friction force microscopy (FFM), conductive AFM (CAFM), Raman spectroscopy, Kelvin probe force microscopy (KPFM), and UHV electronic transport measurements using a two- and four-point probe STM.

Figure 10:
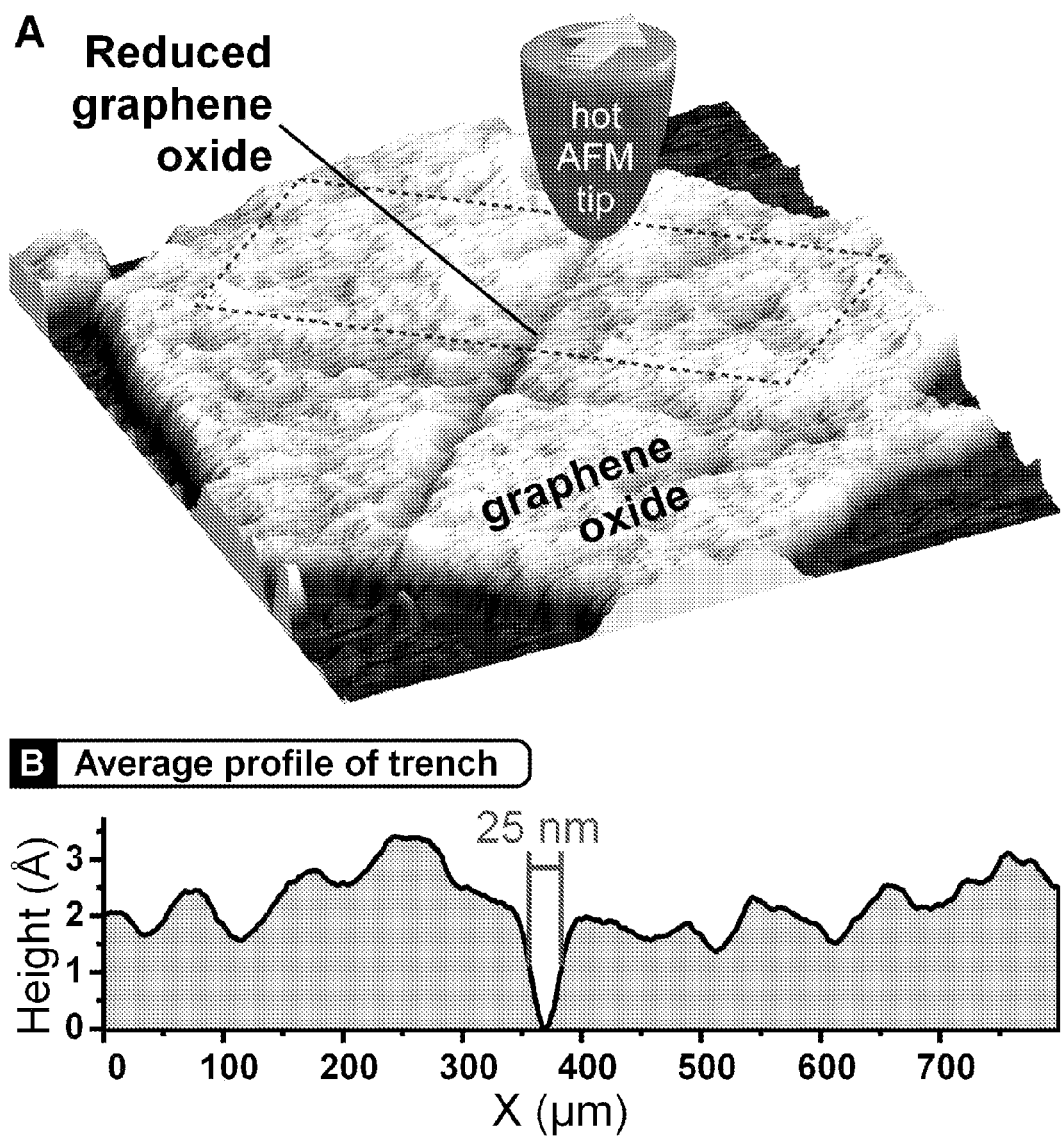
FIG. 10a illustrates the topography of a cross-shaped reduced graphene oxide pattern formed after TCNL at 330° C. scanned across the graphene oxide sheet at about 2 micrometers per second (μm/s) in accordance with some embodiments of the present invention.
FIG. 10b illustrates that the average profile of a trench shown in FIG. 10a was as narrow as about 25 nm.

Arbitrary rGO features such as a cross (FIG. 10) or squares (FIG. 11) were reliably obtained by scanning the heated AFM tip over isolated GO flakes on a $SiO_x$/Si substrate. The thermal reduction decreased the 9.5±1.9 Angstrom (Å) height of the sheet by about 2 to about 5 Å, as obtained from the topography image (FIG. 10). Two effects could lead to height reduction. One is the loss of oxygen rich functional groups from the GO flake surface. Given that scanning an unheated tip does not result in height changes, this loss was primarily caused by intrinsic chemical conversion rather than mechanical removal. It was not possible, however, to rule out tribochemical effects at elevated temperatures. Second, the conversion of GO's sp$^3$ carbon bonds into sp$^2$ carbon bonds will flatten the material since the sp$^3$ carbon bonds in GO ripples the carbon skeleton thereby increasing the sheet thickness.

Figure 11:
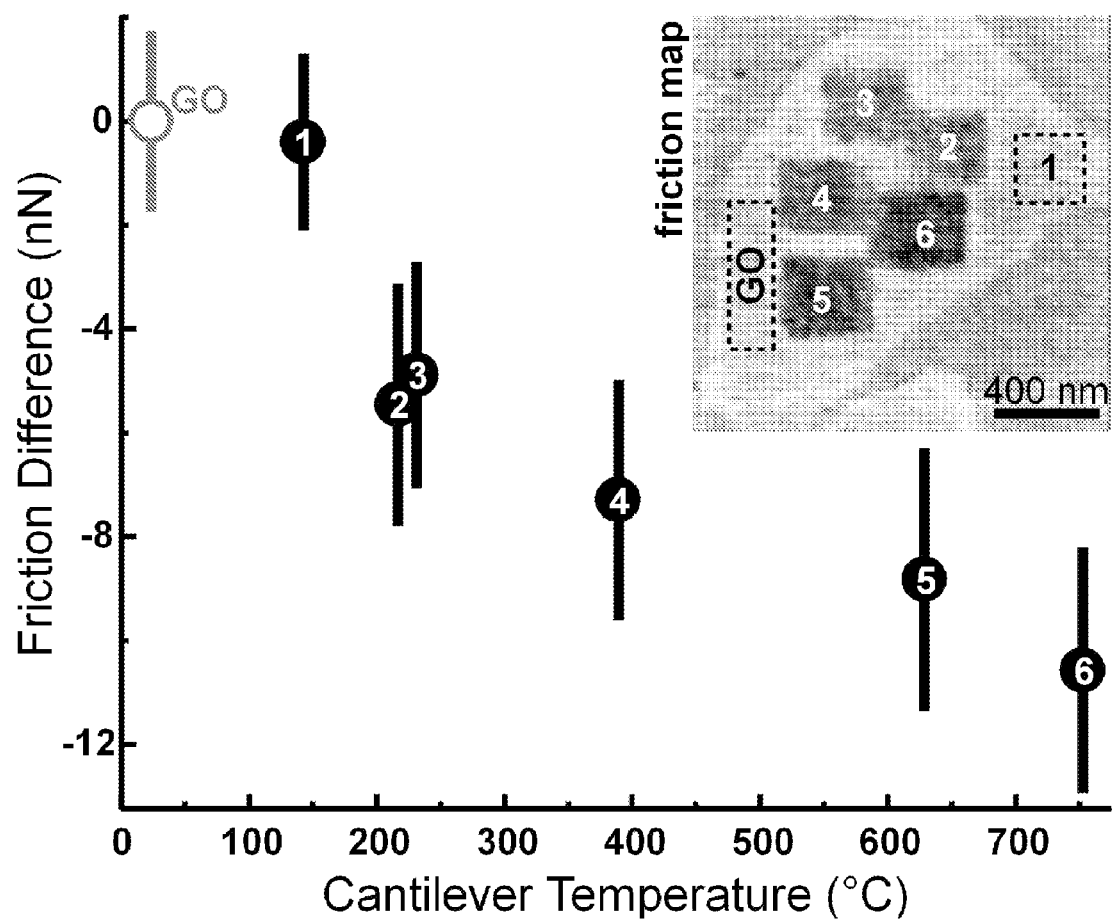
FIG. 11 is a plot that shows the decrease in lateral force on an AFM tip at room temperature as it scans over several squares previously reduced by TCNL at different temperatures, wherein the inset is a room temperature friction image of the graphene oxide sheet on which a heated tip was previously rastered twice over six square areas at a speed of 4 μm/s; and wherein in square 1, the tip was heated during TCNL to temperature ($T_{heater}$) of about 100° C. yielding no apparent reduction while at temperatures $T_{heater}$ greater than about 150° C., the rastered areas (i.e., squares 2 through 6) were thermally reduced.

Friction measurements showed that variable reduction of GO could be achieved by controlling the temperature of the AFM tip. Graphene has a low friction coefficient while oxides typically have higher friction coefficients. Thermal reduction should also reduce friction as the high friction GO is replaced with lower friction graphene. FIG. 11 shows the strong correlation between the cantilever temperature during TCNL processing and the lateral force on a room temperature tip scanned over previously reduced squares. Reduction began at or above 130° C. Higher temperatures increased the rate of reduction, as shown by the roughly linear decrease in relative friction with temperature.

Figure 12:
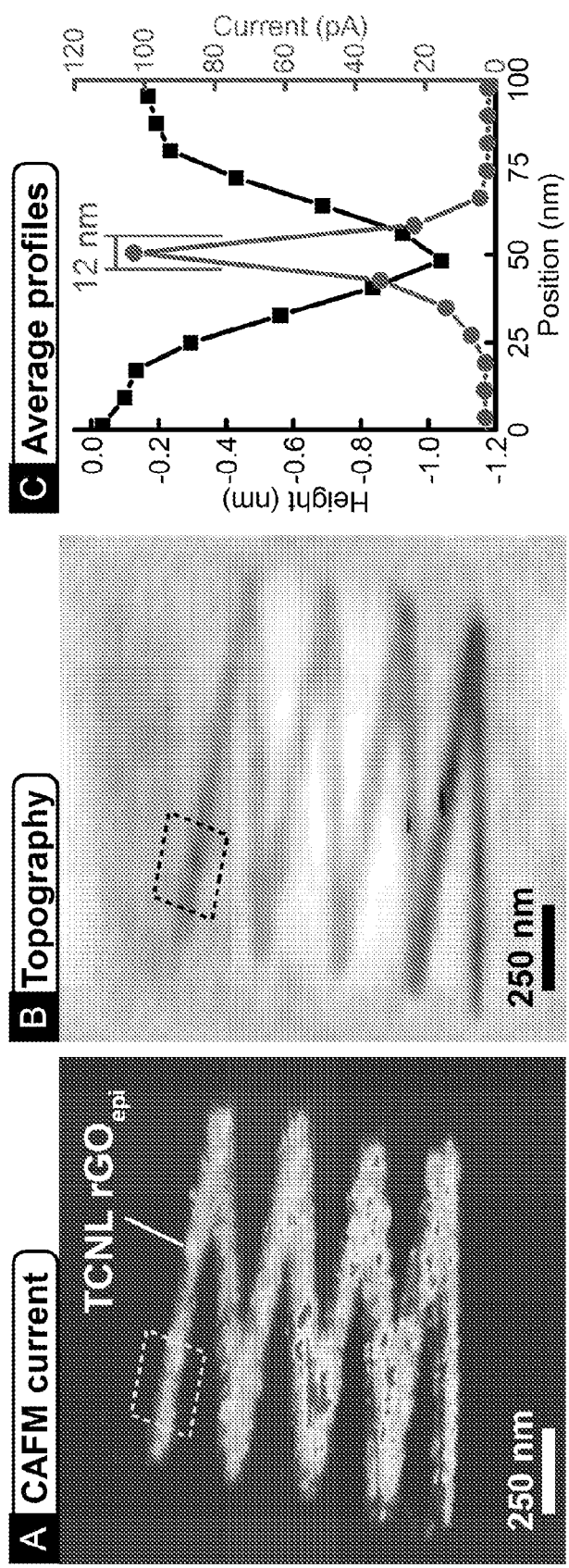
Figure 13:
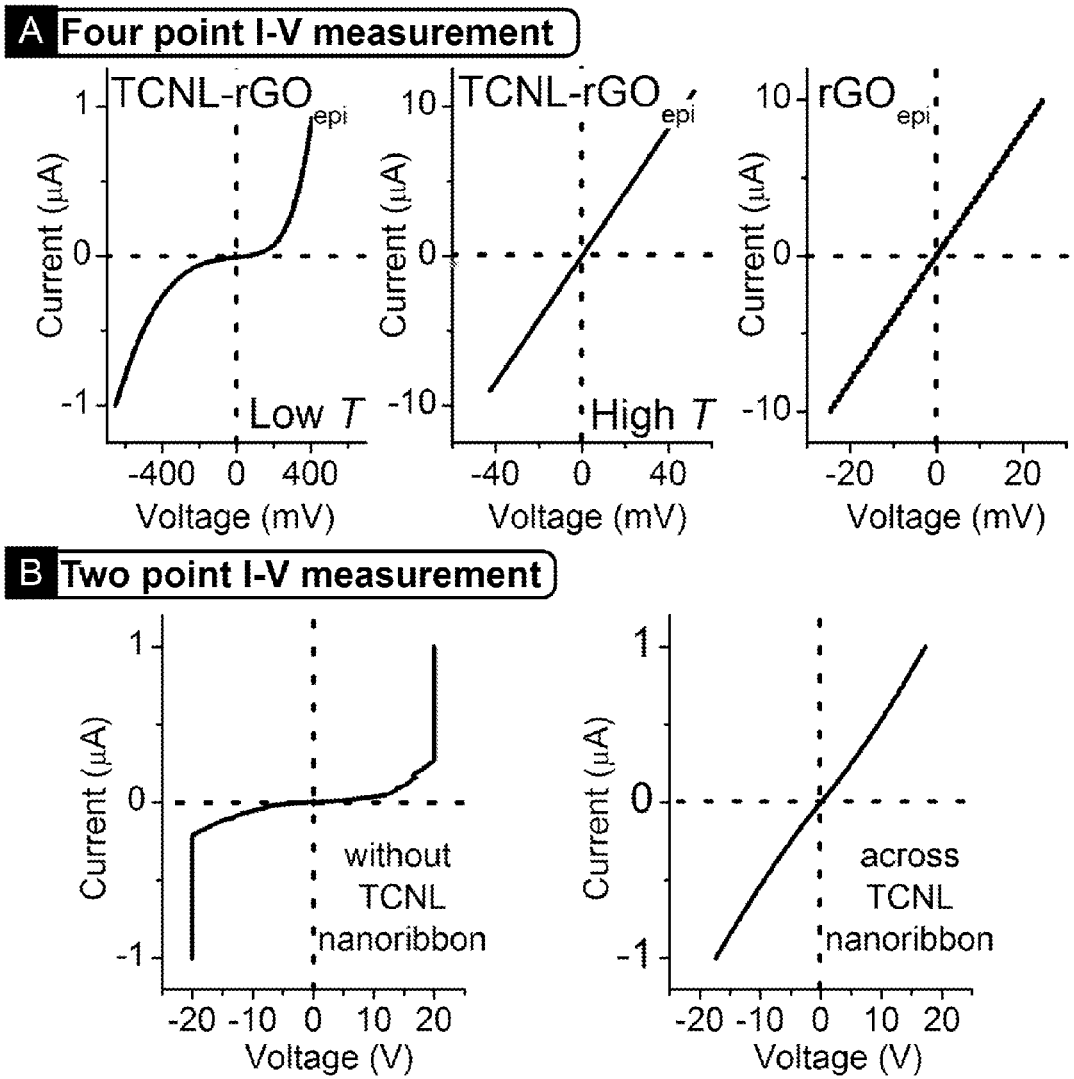
FIG. 13a illustrates current-voltage (I-V) curves obtained by four-point transport measurements of TCNL-reduced graphene oxide squares reduced at low temperature (Low T, $T_{heater}$ of about 600° C.), TCNL-reduced graphene oxide squares reduced at high temperature (High T, $T_{heater}$ of about 1200° C.), and furnace-reduced graphene oxide at about 600° C. in vacuum in accordance with some embodiments of the present invention.
FIG. 13b illustrates I-V curves obtained by two-point transport measurements of current between two $rGO_{epi}$ squares with no nanoribbons in between (left curve), and between two $rGO_{epi}$ squares with a nanoribbon in between (right curve).

Although isolated GO flakes are suited for basic studies, further technological development required extended films of GO. Large area $GO_{epi}$ films (greater than about 15 mm$^2$) were obtained by oxidizing multilayer epitaxial graphene (EG) grown on the carbon face of SiC. The oxidized films consisted of multiple high-quality $GO_{epi}$ layers that completely covered the SiC surface. AFM images showed no tearing in the $GO_{epi}$ films, indicating that they maintained their structural integrity when exposed to the harsh oxidation conditions. FIGS. 12 and 13 show the results obtained by performing TCNL on $GO_{epi}$ films with different thicknesses, as determined by AFM by scratching away $GO_{epi}$ from the SiC substrate. FIG. 12 presents a zigzag $rGO_{epi}$ nanoribbon written with a single line scan at an AFM tip heat of about 1060° C. on $GO_{epi}$. FIG. 12a is an image of the current measured between a conductive platinum AFM tip and each point of the surface, showing no current on the GO surface and a current enhancement of about 100 pA in the $rGO_{epi}$ nanoribbons. These current values were consistent with the presence of about 12 nm wide and several nanometers thick $rGO_{epi}$ nanoribbons presenting a vanishingly small Schottky barrier; and a resistive SiC substrate (resistivity of about $10^5$ $\Omega$cm$^1$). For a 25 nm thick GO film locally heated by a tip at about 1000° C., heat flow through the layers could reduce most of the GO underneath the tip and leave only a few layers of GO at the SiC interface. The topographical image (FIG. 12b and the black graph in FIG. 12c) indicates that the reduction produced a shallow indentation of about 1 nm whose origin was been previously discussed for the isolated GO sheets.

The electrical properties of the locally reduced $GO_{epi}$ structures were further investigated using KPFM and four-point probe transport measurements in a UHV Omicron Nanoprobe system. The sheet resistance, $R_{sheet}$, of 20×20 µm$^2$ squares of TCNL $rGO_{epi}$ decreased with increasing temperature used for the TCNL local reduction, up to four orders of magnitude lower than the resistance of the original $GO_{epi}$ (427±11 M$\Omega$). The same decrease of the in-plane resistivity was observed for extended films of $rGO_{epi}$ produced by overnight heating of $GO_{epi}$ in a furnace at 600° C. (18±10 k$\Omega$). Furthermore, $R_{sheet}$ and the shape of the I-V characteristics could be varied by changing the temperature of the AFM probe (in FIG. 13a, $R_{sheet}$=9174 k$\Omega$ and 30 k$\Omega$ for low and high temperature, respectively). Kelvin probe measurements showed that TCNL $rGO_{epi}$ displayed a contact potential change of 168±54 mV in respect to $GO_{epi}$, similar to bulk reduced rGO (188±96 mV). The presence of residual oxygen and structural disorder led to the large difference in conductivity between epitaxial graphene and $rGO_{epi}$ or TCNL-$rGO_{epi}$.

An isolated TCNL-$rGO_{epi}$ nanoribbon (FIG. 13b) was also analyzed with a length of about 25 µm and a width of about 100 nm, as measured by AFM. I-V data was acquired by placing conductive tips on top of two micron-size squares of $rGO_{epi}$ fabricated in-situ by an electron beam at each end of the nanoribbon. Two point transport measurements indicated a resistance larger than about 2 gigaohms when the tips were positioned on an arbitrary position on the GO surface (very large barrier at the contact) and a drop in resistance from 120 M$\Omega$ (between the 2 squares with no nanoribbon) to 20 M$\Omega$ (between the 2 squares connected by the nanoribbon). The transport changed from insulating to metallic (linear I-V curves) in the presence of the TCNL-$rGO_{epi}$ nanoribbon between the squares (FIG. 13b). By using the relation $R_{sheet}=(R_{ribbon} \cdot W \cdot t_{ribbon})/(L \cdot t_{sheet})$, and assuming a 13 nm thick nanoribbon, a sheet resistance of 65 k$\Omega$ was obtained, which was in good agreement with the measurements reported in FIG. 13a for the microscopic squares of TCNL-$rGO_{epi}$.

TCNL does not require any solvents or lithographic resists that could contaminate the sample. This was especially important because the electronic properties of graphene vary strongly with surface doping. Thus, this example provides an excellent method for fabricating rGO samples.

As illustrated by the above description and examples, TCNL systems and methods are capable of providing several advantages of existing nanolithography techniques. As an example, the speed of TCNL is significantly greater than other AFM-based nanolithography approaches. When compared to dip-pen nanolithography (DPN) performed with a single tip, TCNL (also with a single tip) is over $10^6$ times faster and $10^3$ times faster than thermal DPN. Another benefit of TCNL over other AFM-based techniques is that, because there is no chemical transfer from the AFM tip to the surface, a single AFM tip can be used to write and rewrite on the surface. TCNL is advantageous in that it will work on many different surface compositions, and does not require strict control of atmospheric conditions.

The embodiments of the present invention are not limited to the particular formulations, process steps, and materials disclosed herein as such formulations, process steps, and materials can vary somewhat. Moreover, the terminology employed herein is used for the purpose of describing exemplary embodiments only and the terminology is not intended to be limiting since the scope of the various embodiments of the present invention will be limited only by the appended claims and equivalents thereof. For example, temperature and pressure parameters can vary depending on the particular materials used.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above discussed embodiments, and should only be defined by the following claims and all equivalents.

What is claimed is:

1. A method of modifying a surface, the method comprising: providing a surface comprising a first functional group at a first location; resistively heating an atomic force microscope tip to a specific temperature; positioning the resistively heated atomic force microscope tip adjacent to, or in contact with, the first location effective to heat the first location; thereby removing the first functional group from at least a portion of the first location such that the surface comprises a second functional group at the at least the portion of the first location; wherein the first functional group is a tetrahydropyranyl carbamate, amine N-oxide, tetrahydropyranyl ether, triphenylmethyl ether, tetrahydropyranyl carbonate ester, S-tetrahydropyranyl carbonyl, or ethyl disulfide; and wherein the second functional group is an amine, alcohol, phenol, or thiol, wherein the surface is a cross-linked polymer surface, and the polymer is covalently bonded to a substrate.

2. The method of claim 1, further comprising discontinuing the positioning of the resistively heated atomic force microscope tip adjacent to, or in contact with, the first location.

3. The method of claim 2, further comprising repositioning the resistively heated atomic force microscope tip adjacent to, or in contact with, a second location on the surface effective to heat the second location, wherein the second location comprises the first functional group or a third functional group.

4. The method of claim 3, further comprising removing the first functional group or the third functional group from at least a portion of the second location such that the surface comprises the second functional group or a fourth functional group at the at least the portion of the second location.

5. The method of claim 3, further comprising resistively heating the atomic force microscope tip to a different temperature before repositioning the resistively heated atomic force microscope tip adjacent to, or in contact with, the second location on the surface.

6. The method of claim 1, further comprising moving the resistively heated atomic force microscope tip to a second location on the surface while continuously maintaining the resistively heated atomic force microscope tip adjacent to, or in contact with, the surface from the first location to the second location effective to heat the surface from the first location to the second location, wherein at least a portion of the surface from the first location to the second location comprises the first functional group or a third functional group.

7. The method of claim 6, further comprising removing the first functional group or the third functional group from at least a portion of surface from the first location to the second location such that the surface comprises the second functional group or a fourth functional group, at the at least the portion of the surface from the first location to the second location.

8. The method of claim 1, further comprising functionalizing the second functional group.

9. The method of claim 8, further comprising disposing a biological material, a nanoscale object, or a microscale object on the functionalized second functional group.

10. The method of claim 1, further comprising disposing a biological material, a nanoscale object, or a microscale object on the second functional group.

11. A system for modifying a surface, the system comprising: an atomic force microscope; an atomic force microscope tip; and a resistive heater in electrical communication with the atomic force microscope tip; wherein the resistive heater is configured to provide sufficient heat to the atomic force microscope tip to transfer the heat to a first location on a surface when the atomic force microscope tip is positioned adjacent to, or in contact with, the first location; wherein the transferred heat is effective to remove a first functional group from at least a portion of the first location such that the surface comprises a second functional group at the at least the portion of the first location; wherein the first functional group is a tetrahydropyranyl carbamate, amine N-oxide, tetrahydropyranyl ether, triphenylmethyl ether, tetrahydropyranyl carbonate ester, S-tetrahydropyranyl carbonyl, or ethyl disulfide; and wherein the second functional group is an amine, alcohol, phenol, or thiol, wherein the surface is a cross-linked polymer surface, and the polymer is covalently bonded to a substrate.

12. The method of claim 1, wherein the surface is formed from a polymer represented by a formula $Y_n$-$P_n$-$G_n$, wherein n is a positive integer, Y is a cross-linking functional group, P is a backbone of the polymer, and G is a protecting functional group;

wherein the protecting functional group is configured to react when exposed to heat at a temperature above a thermal deprotection temperature to form a different functional group;
wherein the polymer, once cross-linked, does not soften above the thermal deprotection temperature; and
wherein G is a tetrahydropyranyl carbamate, amine N-oxide, tetrahydropyranyl ether, triphenylmethyl ether, tetrahydropyranyl carbonate ester, S-tetrahydropyranyl carbonyl, or ethyl disulfide.

13. The method of claim 12, wherein the polymer is a co-polymer such that P comprises at least two components, and wherein Y and G are on different components of P.

14. The method of claim 12, wherein Y is a cinnamate group and G is a tetrahydropyranyl carbamate group.

15. The method of claim 14, wherein the polymer is represented by the formula

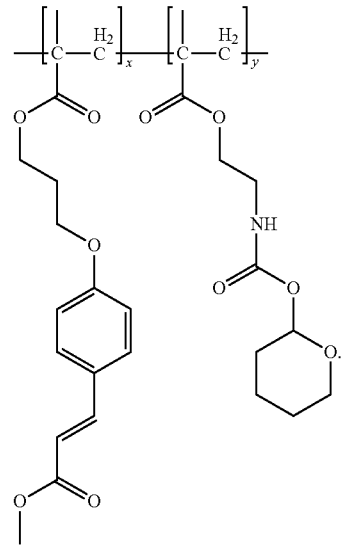

16. The method of claim 12, wherein the polymer is cross-linked before positioning the resistively heated atomic force microscope tip adjacent to, or in contact with, the first location.

17. The method of claim 12, wherein the polymer is disposed on a substrate, and wherein the substrate comprises a surface-modification comprising a cross-linking group that forms a covalent bond to the polymer.

18. The method of claim 1, wherein the second functional group is amine.

19. The method of claim 18, further comprising functionalizing the amine to create patterns of maleimide, aldehyde, thiol and/or biotin.

20. The method of claim 1, wherein the first functional group is a tetrahydropyranyl carbamate, amine N-oxide, triphenylmethyl ether, tetrahydropyranyl carbonate ester, S-tetrahydropyranyl carbonyl, or ethyl disulfide.

* * * * *